United States Patent
Korbler et al.

(10) Patent No.: US 10,607,864 B2
(45) Date of Patent: *Mar. 31, 2020

(54) SYSTEM, APPARATUS, AND METHOD FOR PROCESSING SUBSTRATES USING ACOUSTIC ENERGY

(71) Applicant: NAURA Akrion Inc., Allentown, PA (US)

(72) Inventors: John A. Korbler, Mertztown, PA (US); Carlos M. Ruiz, Breinigsville, PA (US); Michael Ioannou, Allentown, PA (US); Hongseong Son, Allentown, PA (US)

(73) Assignee: NAURA AKRION INC., Allentown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/107,525

(22) Filed: Aug. 21, 2018

(65) Prior Publication Data

US 2019/0006205 A1    Jan. 3, 2019

Related U.S. Application Data

(62) Division of application No. 14/490,080, filed on Sep. 18, 2014, now Pat. No. 10,079,164.

(60) Provisional application No. 61/879,492, filed on Sep. 18, 2013.

(51) Int. Cl.
*B06B 1/06* (2006.01)
*H01L 21/67* (2006.01)

(52) U.S. Cl.
CPC .............................. *H01L 21/67057* (2013.01)

(58) Field of Classification Search
CPC ....................................................... B06B 3/00
See application file for complete search history.

(56) References Cited

U.S. PATENT DOCUMENTS

| | | |
|---|---|---|
| 2007/0053789 A1 | 3/2007 | Ricciardi et al. |
| 2007/0169800 A1* | 7/2007 | Fani .......................... B08B 3/12 134/56 R |
| 2007/0175502 A1 | 8/2007 | Sliwa et al. |
| 2008/0017219 A1* | 1/2008 | Franklin ................... B08B 3/12 134/1 |

(Continued)

OTHER PUBLICATIONS

Corresponding International Search Report and Written Opinion dated Dec. 31, 2014.

*Primary Examiner* — Jason Y Ko
(74) *Attorney, Agent, or Firm* — The Belles Group, P.C.

(57) ABSTRACT

A system, apparatus, and method for processing substrates using acoustic energy. In one aspect, the invention can be a system for processing flat articles including a support for supporting the flat article and an acoustic energy treatment apparatus. The acoustic energy treatment apparatus may include a support arm and a plurality of transducer assemblies coupled thereto. The transducer assemblies may include a housing with a transducer coupled thereto, and the housings of the transducer assemblies may be arranged in an end-to-end manner. A trough may also be included that extends along at least a portion of a length of the transducer assemblies. The trough may serve as a reservoir that upon being filled and overflowed with a liquid allows the liquid to fluidly couple the transducer assemblies to the flat article.

16 Claims, 17 Drawing Sheets

(56) References Cited

U.S. PATENT DOCUMENTS

2010/0108093 A1 5/2010 Grant et al.
2011/0041871 A1 2/2011 Yan

* cited by examiner

SYSTEM, APPARATUS, AND METHOD FOR PROCESSING SUBSTRATES USING ACOUSTIC ENERGY

CROSS-REFERENCE TO RELATED APPLICATIONS

The present application is a divisional of U.S. patent application Ser. No. 14/490,080, filed Sep. 18, 2014, which claims the benefit of U.S. Provisional Patent Application Ser. No. 61/879,492, filed Sep. 18, 2013, the entireties of which are incorporated herein by reference.

FIELD OF THE INVENTION

The present invention relates generally to a system and apparatus for generating acoustic energy for the processing of substrates, such as semiconductor wafers, raw silicon substrates, flat panel displays, solar panels, photomasks, discs, magnetic heads or any other item that requires a high level of processing precision. Specifically, the invention relates to an acoustic generating apparatus, or a system incorporating the same, that can provide high levels of particle removal efficiency from flat articles containing delicate devices that minimizes damage to the delicate devices.

BACKGROUND OF THE INVENTION

In the field of semiconductor manufacturing, it has been recognized since the beginning of the industry that removing particles from semiconductor wafers during the manufacturing process is a critical requirement to producing quality profitable wafers. While many different systems and methods have been developed over the years to remove particles from semiconductor wafers, many of these systems and methods are undesirable because they cause damage to the wafers. Thus, the removal of particles from wafers must be balanced against the amount of damage caused to the wafers by the cleaning method and/or system.

Existing techniques for freeing the particles from the surface of a semiconductor wafer utilize a combination of chemical and mechanical processes. One typical cleaning chemistry used in the art is standard clean 1 ("SC1"), which is a mixture of ammonium hydroxide, hydrogen peroxide, and water. SC1 oxidizes and etches the surface of the wafer. This etching process, known as undercutting, reduces the physical contact area to which the particle binds to the surface, thus facilitating removal. However, a mechanical process is still required to actually remove the particle from the wafer surface.

For larger particles and for larger devices, scrubbers have been used to physically brush the particle off the surface of the wafer. However, as devices have shrunk in size, scrubbers and other forms of physical cleaners have become inadequate because their physical contact with the wafers causes catastrophic damage to smaller devices.

The application of acoustic energy during wet processing has gained widespread acceptance to effectuate particle removal, especially to clean sub-micron particles off wafers (or other flat articles) undergoing fabrication in the semiconductor process line. The application of acoustic energy to substrates has proven to be a very effective way to remove particles and to improve the efficiency of other process steps, but as with any mechanical process, damage to the substrates and devices thereon is still possible. Thus, a need exists for a cleaning apparatus or system that can break particles free from the delicate surfaces of a semiconductor wafer without damaging the device structure and while enhancing cleaning uniformity.

BRIEF SUMMARY OF THE INVENTION

Exemplary embodiments according to the present disclosure are directed to a system, apparatus, and method of processing flat articles, such as semiconductor wafers and substrates, using acoustic energy. Such a system may include a support for supporting a flat article to be processed and an acoustic energy treatment apparatus. The acoustic energy treatment apparatus may include one of more transducer assemblies. In some embodiments, the acoustic energy treatment apparatus may also include a trough for dispensing a liquid onto the wafer. Various configurations of the transducer assemblies are possible to increase the particle removal from the flat article and increase uniformity of cleaning all while minimizing damage to the surfaces of the flat article.

In one aspect, the invention can be a system for processing flat articles comprising: a support for rotatably supporting a flat article; an acoustic energy treatment apparatus comprising: a support arm extending along a first longitudinal axis from a proximal end to a distal end; a plurality of first transducer assemblies coupled to the support arm, each of the first transducer assemblies comprising a first housing and a first transducer acoustically coupled to the first housing, each of the first housings extending from a first end to a second end, the first housings positioned adjacent to one another in an end-to-end manner along a second longitudinal axis; a plurality of second transducer assemblies coupled to the support arm, each of the second transducer assemblies comprising a second housing and a second transducer acoustically coupled to the second housing, each of the second housings extending from a first end to a second end, the second housings positioned adjacent to one another in an end-to-end manner along a third longitudinal axis.

In another aspect, the invention can be a system for processing flat articles comprising: a support for rotatably supporting a flat article; an acoustic energy treatment apparatus comprising: a support arm extending along a first longitudinal axis from a proximal end to a distal end; a first transducer assembly coupled to the support arm and extending along a length, the first transducer assembly comprising a first transducer for generating acoustic energy; and a trough coupled to the support arm adjacent to the first transducer assembly, the trough extending along at least a portion of the length of the first transducer assembly; a liquid supply subsystem configured to introduce liquid into the trough; and a controller operably coupled to the liquid supply subsystem, the controller configured to introduce the liquid into the trough so that the liquid fills and overflows the trough during operation of the transducer assembly, the overflowing liquid forming a fluid coupling between the first transducer assembly and a surface of the flat article.

In yet another aspect, the invention can be a method for processing flat articles comprising: positioning a flat article on a support and rotating the flat article; positioning an acoustic energy treatment apparatus adjacent to a surface of the flat article, the acoustic energy treatment apparatus comprising a support arm extending along a longitudinal axis, a first transducer assembly coupled to the support arm and extending along a length, the first transducer assembly comprising a first transducer for generating acoustic energy, and a trough coupled to the support arm adjacent to the first transducer assembly along at least a portion of the length of the first transducer assembly; introducing a liquid into the trough so that the liquid overflows the trough, the overflowing liquid at least partially covering the surface of the flat article and forming a fluid coupling between the surface of the flat article and the first transducer assembly; and activating the first transducer to generate acoustic energy onto the surface of the flat article.

In a further aspect, the invention can be an apparatus for generating acoustic energy and dispensing a liquid onto a surface of a flat article comprising: a support arm extending from a proximal end to a distal end along a first longitudinal axis; a first transducer assembly coupled to the support arm, the first transducer comprising a first transducer for generating acoustic energy; a second transducer assembly coupled to the support arm, the second transducer assembly comprising a second transducer for generating acoustic energy; and a trough coupled to the support arm between the first and second transducer assemblies, the trough spaced apart from the first transducer assembly by a first gap and the second transducer assembly by a second gap.

In a still further aspect, the invention can be a system for processing flat articles comprising: a support for rotatably supporting a flat article; an acoustic energy treatment apparatus comprising: a body extending along a first longitudinal axis from a proximal end to a distal end; and a plurality of first transducer assemblies coupled to the body, each of the first transducer assemblies comprising a first housing and a first transducer acoustically coupled to the first housing, each of the first housings extending from a first end to a second end, the first housings positioned adjacent to one another in an end-to-end manner along a second longitudinal axis.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE INVENTION

Figure 1:
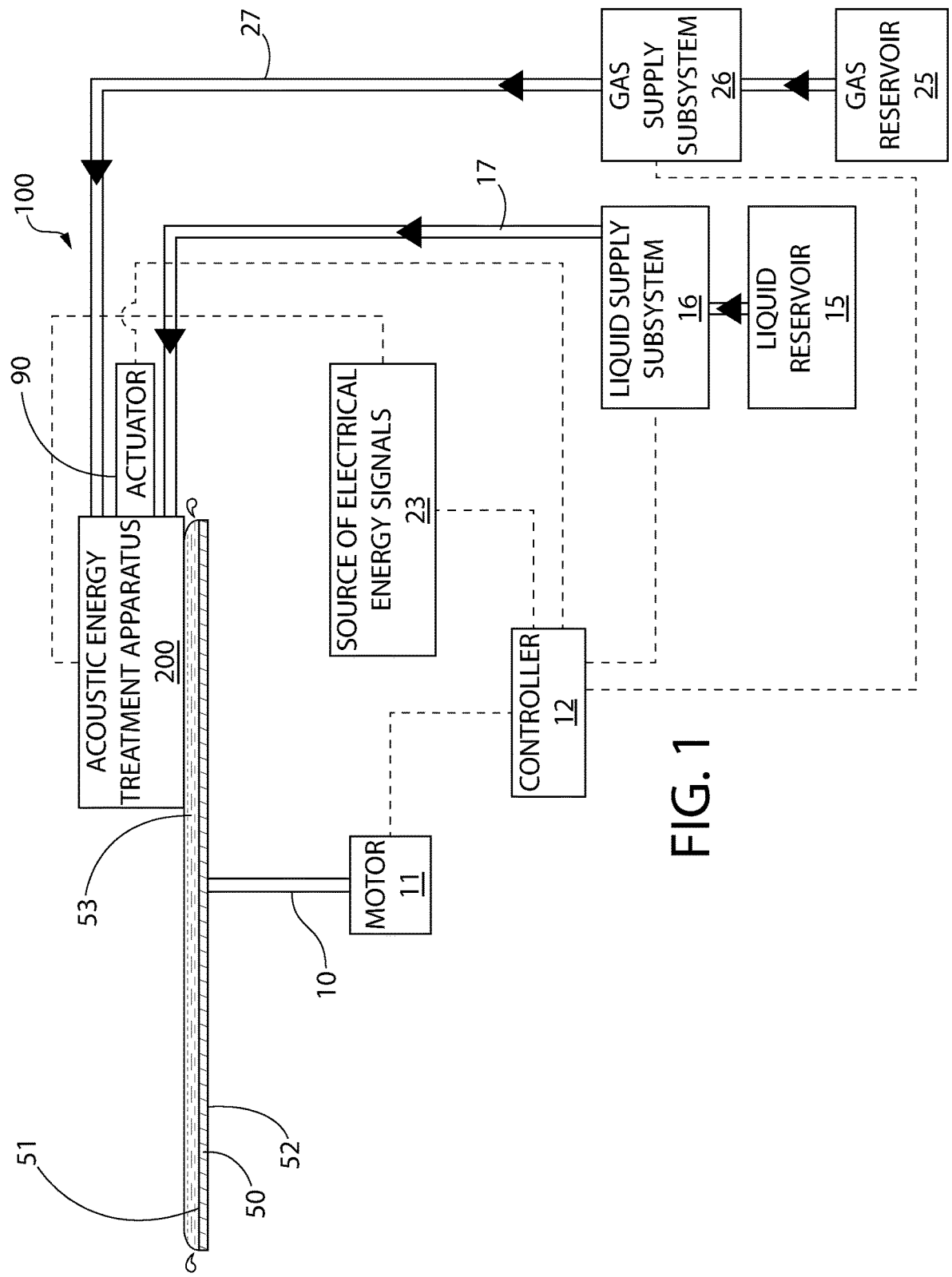
FIG. 1 is a schematic of a system for processing flat articles in accordance with a first embodiment of the present invention.

The following description of the preferred embodiment(s) is merely exemplary in nature and is in no way intended to limit the invention, its application, or uses.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the exemplified embodiments. Accordingly, the invention expressly should not be limited to such exemplary embodiments illustrating some possible non-limiting combination of features that may exist alone or in other combinations of features; the scope of the invention being defined by the claims appended hereto.

Referring first to FIG. 1, a schematic of a system for processing or cleaning flat articles 100 (hereinafter referred to as "cleaning system 100") is illustrated according to one embodiment of the present invention. For ease of discussion the inventive system and methods of the drawings will be discussed in relation to the cleaning of flat articles. Flat articles can include, for example without limitation, semiconductor wafers, raw silicon substrates, flat panel displays, solar panels, photomasks, discs, magnetic heads, or any other item that requires a high level of processing precision as would be appreciated by those of ordinary skill in the art.

The cleaning system 100 generally comprises a rotatable support 10 for supporting a flat article 50 in a substantially horizontal orientation and an acoustic energy treatment apparatus 200. Although described herein as a flat article 50, in some embodiments the flat article 50 may be a semiconductor wafer or any other device that undergoes wet processing, including the devices noted herein above. In the exemplified embodiment, the flat article 50 is positioned on the support 10 so that a first surface 51 (i.e., top surface) of the flat article 50 is the device side of the flat article 50 while a second surface 52 (i.e., bottom surface) of the flat article 50 is the non-device side of the flat article 50. Of course, the flat article 50 can be supported so that the first surface 51 is the non-device side while the second surface 52 is the device side if desired. The acoustic energy treatment apparatus 200 is able to both generate acoustic energy that is applied to the first surface 51 (or the second surface 52 if desired) of the flat article 50 and dispense a fluid or liquid onto the first or second surfaces 51, 52 of the flat article 50. Although not illustrated herein, in some embodiments the cleaning system 100 may also include a bottom dispenser for dispensing a fluid onto a second surface 52 of the flat article 50 and acoustic energy may be transmitted onto both of the first and second surfaces 51, 52 of the flat article 50.

In the exemplified embodiment, the rotatable support 10 is designed to contact and engage only a perimeter of the flat article 50 in performing its support function. However, the exact details of the structure of the rotatable support 10 are not limiting of the present invention and a wide variety of other support structures can be used, such as chucks, support plates, etc. Additionally, while it is preferred that the support structure support can rotate the semiconductor wafer in a substantially horizontal orientation, in other embodiments of the invention, the system may be configured so that the semiconductor wafer is supported in other orientations, such as vertical or at an angle. In such embodiments, the remaining components of the cleaning system 100, including the acoustic energy treatment apparatus 200, can be correspondingly repositioned in the system so as to be capable of performing the desired functions and/or the necessary relative positioning with respect to other components of the system as discussed below. In certain exemplified embodiments, the cleaning system 100 works in a gaseous environment such that the acoustic energy treatment apparatus 200 is substantially surrounded by gas rather than liquid although the acoustic energy treatment apparatus 200 may be fluidly coupled to the flat article 50 as illustrated in FIG. 1.

Figure 2:
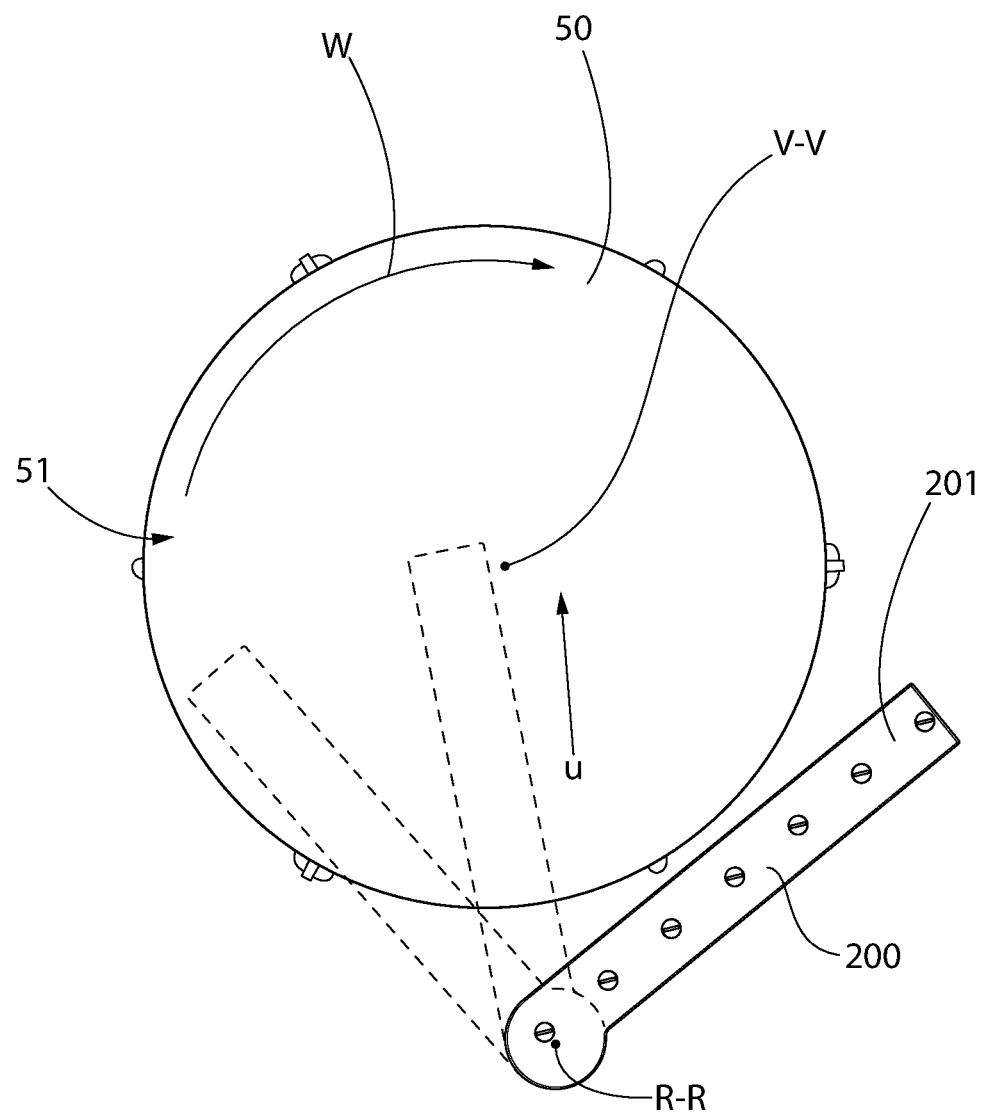
FIG. 2 is a schematic of a wafer and an acoustic energy treatment apparatus positioned over the wafer illustrating potential movement of the acoustic energy treatment apparatus.

Referring to FIGS. 1 and 2 concurrently, in the exemplified embodiment the rotary support 10 is operably coupled to a motor 11 to facilitate rotation of the flat article 50 within the horizontal plane of support in the direction of the arrow W (i.e., clockwise) or in the opposite direction (i.e., counter clockwise) about a rotational axis V-V. The motor 11 is preferably a variable speed motor that can rotate the support 10 at any desired rotational speed and the rotational speed can change during a processing regimen. The motor 11 is electrically and operably coupled to a controller 12. The controller 12 controls the operation of the motor 11, ensuring that the desired rotational speed and desired duration of rotation are achieved. Furthermore, the acoustic energy treatment apparatus 200, or portions thereof as described in more detail below, is configured to be movable relative to the flat article 50. Specifically, in the exemplified embodiment the acoustic energy treatment apparatus 200, or portions thereof, is configured for rotational movement about a rotational axis R-R. Thus, the acoustic energy treatment apparatus 200 can rotate about the rotational axis R-R from a parked position Z, to a processing position Y, to a max sweep position X. Thus, in the exemplified embodiment the acoustic energy treatment apparatus 200 can rotate approximately 90° back-and-forth over the flat article 50 during processing thereby forming an arch-like movement over the flat article 50. In other embodiments, the acoustic energy treatment apparatus 200 may move in a translational direction relative to the flat article 50. The various types of movement of the acoustic energy treatment apparatus 200 relative to the flat article 50 are described in United States Patent Application Publication No. 2014/0216508, the entirety of which is incorporated herein by reference.

As noted above, the acoustic energy treatment apparatus 200 of the cleaning system 100 operates as both an acoustic energy generating structure and a dispenser. Specifically, as will be discussed in more detail below, the acoustic energy treatment apparatus 200 may be operably and fluidly coupled to a liquid supply subsystem 16 via a liquid supply line 17. The liquid supply subsystem 16 is in turn fluidly connected to a liquid reservoir 15 and to the controller 12. The liquid supply subsystem 16 controls the supply of liquid to the acoustic energy treatment apparatus 200 and the acoustic energy treatment apparatus 200 applies/dispenses the liquid onto the first surface 51 of the flat article 50 as discussed in more detail below. Thus, using the acoustic energy treatment apparatus 200, a separate dispenser for dispensing liquid onto the flat article 50 is not needed because the acoustic energy treatment apparatus 200 includes the necessary components, structure, and connections to enable it to dispense the liquid onto the flat article 50. The components of the acoustic energy treatment apparatus 200 that facilitate such dispensing of liquid will be discussed in more detail below.

The liquid supply subsystem 16, which is schematically illustrated as a box for purposes of simplicity, comprises the desired arrangement of all of the necessary pumps, valves, ducts, connectors and sensors for controlling the flow and transmission of the liquid throughout the cleaning system 100. The direction of the liquid flow is represented by the arrows on the supply line 17. Those skilled in the art will recognize that the existence, placement, and functioning of the various components of the liquid supply subsystem 16 will vary depending upon the needs of the cleaning system 100 and the processes desired to be carried out thereon, and can be adjusted accordingly. In certain exemplified embodiments, the components of the liquid supply subsystem 16 are operably connected to and controlled by the controller 12.

Figure 11:
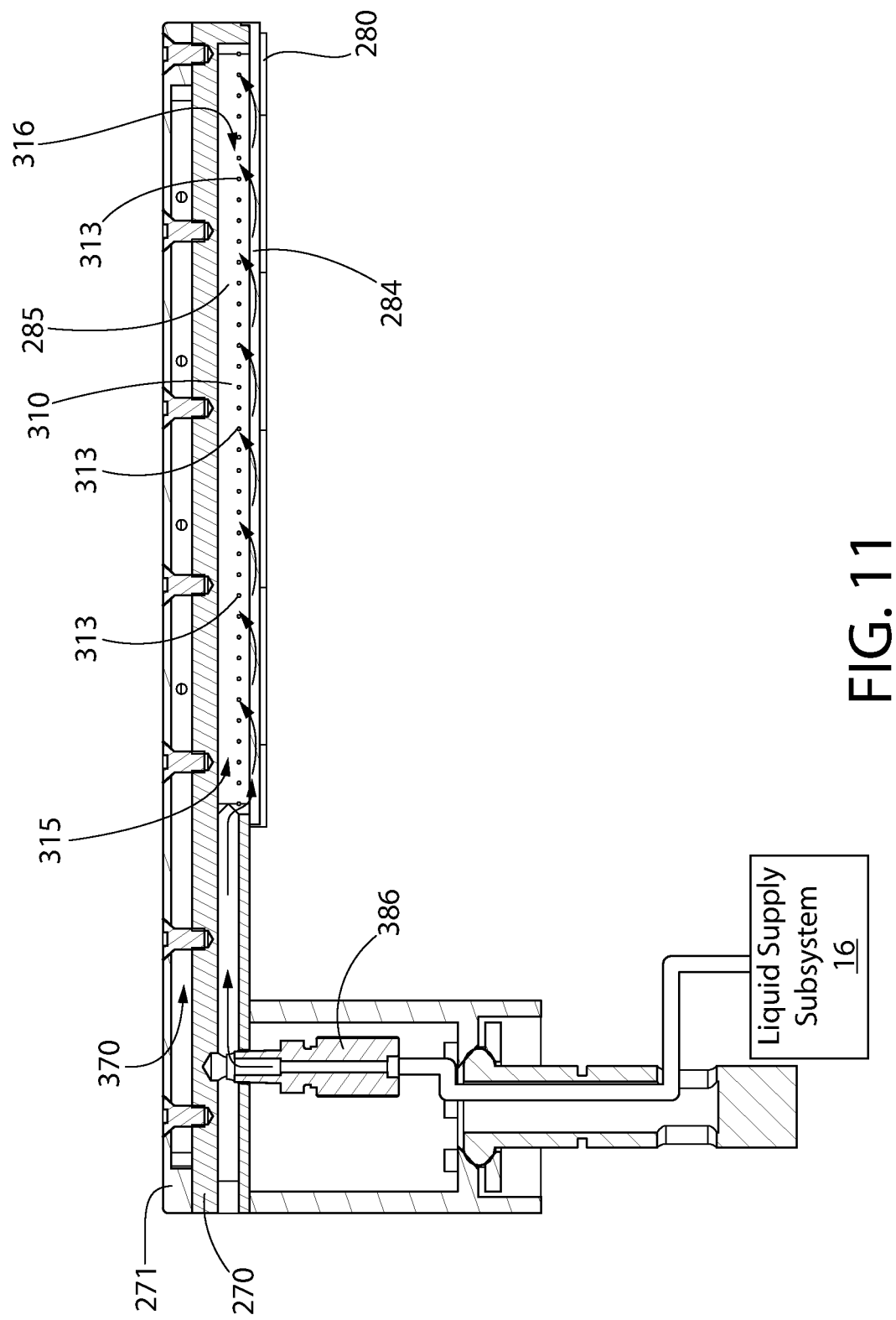
FIG. 11 is a cross-sectional view taken along line XI-XI in FIG. 10.
Figure 12:
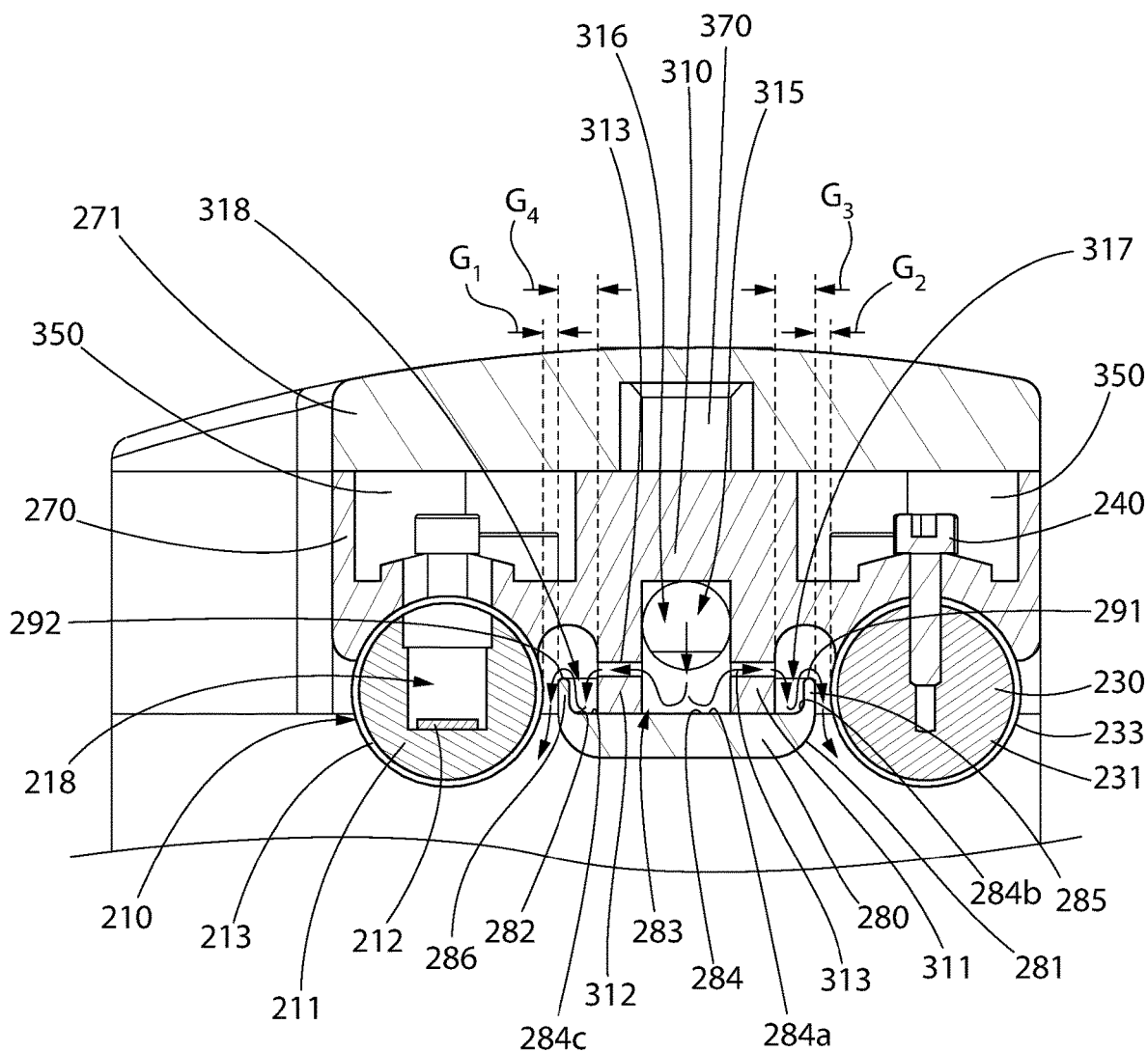
FIG. 12 is a cross-sectional view taken along line XII-XII in FIG. 8.

The liquid reservoir 15 holds the desired liquid to be supplied to the flat article 50 for the processing that is to be carried out. For the cleaning system 100, the liquid reservoir 15 will hold a cleaning liquid, such as for example deionized water ("DIW"), standard clean 1 ("SC1"), standard clean 2 ("SC2"), ozonated deionized water ("DIO$_3$"), dilute or ultra-dilute chemicals, any other liquid that is commonly used for semiconductor wafer cleaning and/or combinations thereof. As used herein, the term "liquid" includes at least liquids, liquid-liquid mixtures and liquid-gas mixtures. It is also possible for certain other supercritical and/or dense fluids to qualify as liquids in certain situations. In certain embodiments it may be possible to have multiple liquid reservoirs. For example, in some embodiments of the invention, the acoustic energy treatment apparatus 200 can be operably and fluidly coupled to several different liquid reservoirs. This would allow the application of different liquids to the first surface 51 of the flat article 50 if desired. The operation of the liquid dispensing will be described in more detail below with reference to FIGS. 11 and 12.

In the exemplified embodiment, the cleaning system 100 also includes a gas supply subsystem 26 operably coupled to the acoustic energy treatment apparatus 200 via a gas supply line 27. The gas supply subsystem 26 is in turn fluidly coupled to a gas reservoir and to the controller 12. The gas supply subsystem 26 controls the supply of gas to the acoustic energy treatment apparatus 200. Specifically, the flow of gas into and through the acoustic energy treatment apparatus 200 is desirable in some embodiments to cool the transducers. Thus, the gas reservoir 25 may contain nitrogen gas or any other desired gas that will not interfere with the operation of the acoustic energy treatment apparatus 200. Specifically, although nitrogen gas may be preferred in some embodiments, in other embodiments the gas may be oxygen, helium, carbon dioxide, or the like. The gas supply subsystem 26 will flow the desired gas into the acoustic energy treatment apparatus 200 to cool the transducers. This process will be described in more detail below with reference to FIGS. 13 and 14.

The gas supply subsystem 26, which is schematically illustrated as a box for purposes of simplicity, comprises the desired arrangement of all of the necessary pumps, valves, ducts, connectors and sensors for controlling the flow and transmission of the gas throughout the cleaning system 100. The direction of the gas flow is represented by the arrows on the supply line 27. Those skilled in the art will recognize that the existence, placement and functioning of the various components of the gas supply subsystem 26 will vary depending upon the needs of the cleaning system 100 and the processes desired to be carried out thereon, and can be adjusted accordingly. In certain exemplified embodiments, the components of the gas supply subsystem 26 are operably connected to and controlled by the controller 12.

The cleaning system 100 further comprises an actuator 90 that is operably coupled to the acoustic energy treatment apparatus 200. The actuator 90 is operably coupled to and controlled by the controller 12. The actuator 90 can be a pneumatic actuator, a drive-assembly actuator, or any other style desired to effectuate the necessary movement of the acoustic energy treatment apparatus 200 or portions thereof. The actuator 90 can translate the acoustic energy treatment apparatus 200 (or portions thereof) between a first position and a second position and any position therebetween. In certain embodiments, the actuator 90 may move the acoustic energy treatment apparatus 200 in a linear direction. In other embodiments, the actuator 90 may move the acoustic energy treatment apparatus 200 in an arcuate or rotational direction, such as about the rotational axis R-R as discussed above. The movement of the acoustic energy treatment apparatus 200 may be similar to that of the tone arm of a vintage record player. Specifically, one end of the acoustic energy treatment apparatus 200 may be held non-movably in place and form a pivot point and the other end of the acoustic energy treatment apparatus 200 may be capable of rotating about the pivot point.

In certain embodiments, the cleaning system 100 also comprises an electrical energy signal source 23 that is operably coupled to the acoustic energy treatment apparatus 200. The electrical energy signal source 23 creates the electrical signal that is transmitted to one or more transducers of the acoustic energy treatment apparatus 200 for conversion into corresponding acoustic energy, which is then transmitted to the flat article 50 via a liquid coupling between the acoustic energy treatment apparatus 200 and the flat article 50. Specifically, in certain embodiments transducers, which may be formed of a piezoelectric material such as a ceramic or crystal, form a part of the acoustic energy treatment apparatus 200. In such embodiments, the one or more transducers are operably coupled to the source of electrical energy 23. An electrical energy signal (i.e. electricity) is supplied to the transducers from the source of electrical energy 23. The transducers convert this electrical energy signal into vibrational mechanical energy (i.e. acoustic energy) which is then transmitted to the flat article 50 being processed. The energy generated by the transducers is described herein as being acoustic energy, and it may be ultrasonic energy, megasonic energy, or the like.

More specifically, the transducers generally comprise a first electrical contact (such as a first metal layer), a piezoelectric crystal, and a second electrical contact (such as a second metal layer). Each of the first and second electrical contacts is coupled to the source of electrical energy 23. Specifically, one of the first and second electrical contacts is a positive contact and the other of the first and second electrical contacts is a negative contact. As a result of the connections, electrical energy transmits through the piezoelectric crystal, thereby enabling the piezoelectric crystal to transmit the vibrational energy as noted herein above.

Figure 3:
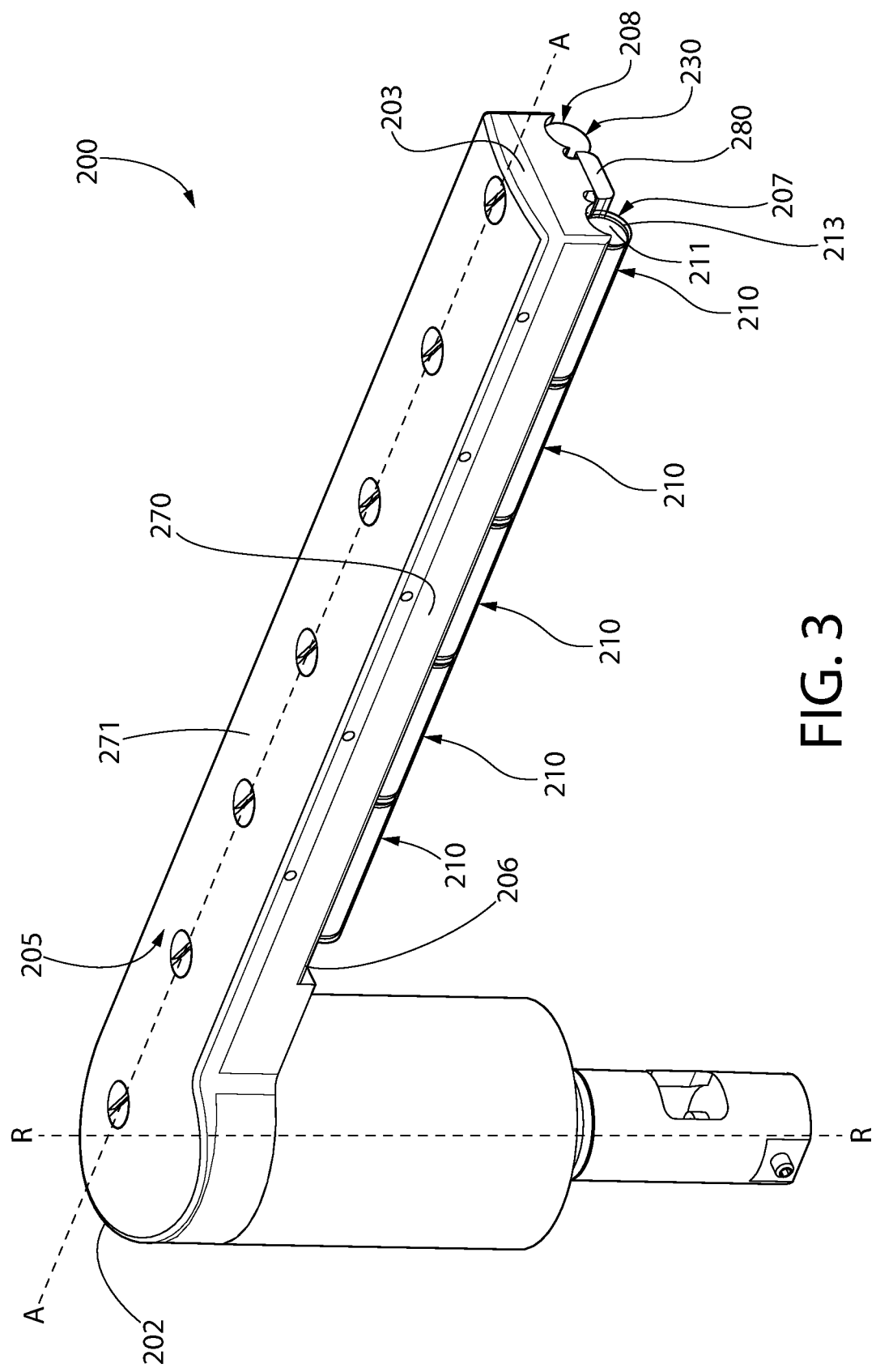
FIG. 3 is a top perspective view of the acoustic energy treatment apparatus of FIG. 2.
Figure 4:
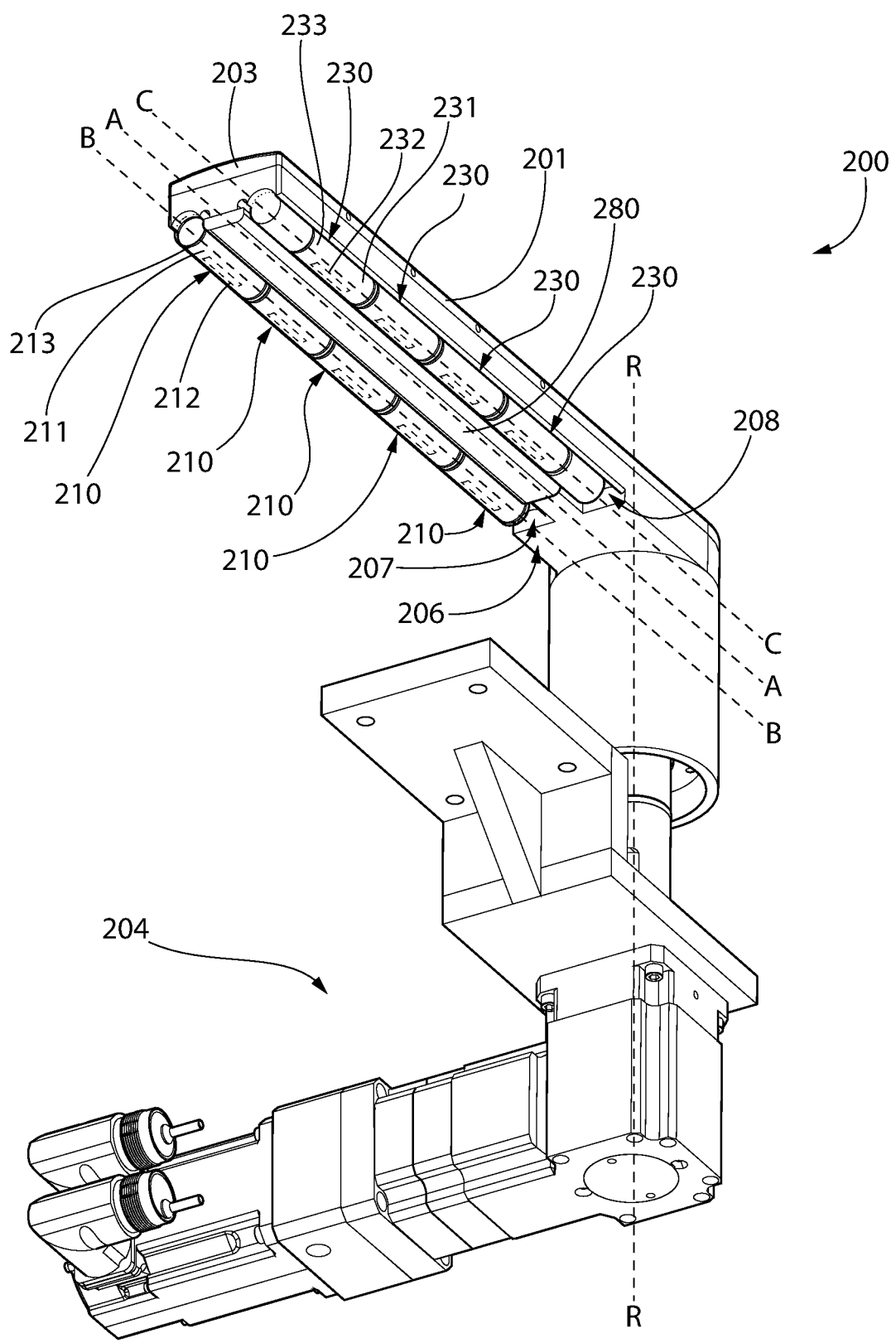
FIG. 4 is bottom perspective view of the acoustic energy treatment apparatus of FIG. 2.

The transmission of the acoustic energy from the transducers to the flat article 50 is typically accomplished through a liquid that is positioned between the acoustic energy treatment apparatus 200 and the flat article 50 and that therefore acoustically couples the one or more transducers to the substrate (discussed in more detail below). In certain embodiments, a material capable of acoustic energy transmission may be positioned between the transducer and the fluid coupling layer to avoid shorting of the electrical contacts on the piezoelectric material. Such as layer, referred to as a shell herein below (see shells 213, 231 in FIGS. 3, 5A and 5B), electrically isolates the electrical contacts of the transducers from the liquid. Thus, in certain embodiments the shell is formed of a dielectric material. Furthermore, the shell may be produced of a material that is inert with respect to the fluid coupling layer (i.e., the liquid) to avoid ion contamination of the substrate. One specific material that may be used for the shell is perfluoroalkoxy alkane ("PFA"). Another specific material that may be used for the shell is fluorinated ethylene propylene (FEP). FEP may be preferable in certain embodiments because it is less permeable than PFA so that it is more difficult for the chemical/liquid to diffuse through the shell. Other materials that may be used for the shell include polymers, quartz, sapphire, boron nitride, vitreous carbide, plastic, and metals. The shell can take on a wide variety of structural arrangements, including a thin layer, a rigid plate, a rod-like probe, a lens, etc. The details of the components of the acoustic energy treatment apparatus 200, including the transducers and the shell, will be discussed in more detail below. In certain embodiments, a dielectric adhesive may be used in addition to or instead of the shell to electrically isolate the transducer from the liquid.

The electrical energy signal source 23 is operably coupled to and controlled by the controller 12. As a result, the controller 12 will dictate the activation status, frequency, power level, and duration of the acoustic energy generated by the acoustic energy treatment apparatus 200, and more specifically the acoustic energy generated by each of the transducers of the acoustic energy treatment apparatus 200. In certain embodiments, the electrical energy signal source 23 is controlled so that the acoustic energy generated by the acoustic energy treatment apparatus 200 has a frequency in the megasonic range. Depending on system requirements, it may not be desirable to use a single electrical energy signal source to control all of the transducers of the acoustic energy treatment apparatus 200. Thus, in other embodiments of the invention, multiple electrical energy signal sources may be used, such as for example one for each transducer of the acoustic energy treatment apparatus 200.

The controller 12 may be a processor, which can be a suitable microprocessor based programmable logic controller, personal computer, or the like for process control. The controller 12 preferably includes various input/output ports used to provide connections to the various components of the cleaning system 100 that need to be controlled and/or communicated with. The electrical and/or communication connections are indicated in dotted line in FIG. 1. The controller 12 also preferably comprises sufficient memory to store process recipes and other data, such as thresholds inputted by an operator, processing times, rotational speeds, processing conditions, processing temperatures, flow rates, desired concentrations, sequence operations, and the like. The controller 12 can communicate with the various components of the cleaning system 100 to automatically adjust process conditions, such as flow rates, rotational speed, movement of the components of the cleaning system 100, etc. as necessary. The type of system controller used for any given system will depend on the exact needs of the system in which it is incorporated.

The acoustic energy treatment apparatus 200 is positioned and oriented so that when a liquid is flowed therethough, the liquid is dispensed onto the first surface 51 of the flat article 50. When the flat article 50 is rotating, this liquid forms a layer or film of the liquid 53 across a portion of or a substantial entirety of the first surface 51 of the flat article 50. Due to the positioning of the acoustic energy treatment apparatus 200 adjacent the first surface 51 of the flat article 50 (see FIG. 1), the film of liquid 53 is formed between the acoustic energy treatment apparatus 200 and the first surface 51 of the flat article 50, and thus the liquid fluidly couples the acoustic energy treatment apparatus 200 to the flat article 50. More specifically, the acoustic energy treatment apparatus 200 is positioned so that a small gap exists between a portion of the acoustic energy treatment apparatus 200 and the first surface 51 of the flat article 50. This gap is sufficiently small so that when the liquid is applied to the first surface 51 of the flat article 50, a meniscus of liquid is formed between the first surface 51 of the flat article 50 and the portion of the acoustic energy treatment apparatus 200. The meniscus is not limited to any specific shape.

Referring now solely to FIG. 2, a schematic representation of the flat article 50 and the acoustic energy treatment apparatus 200 is provided in accordance with one embodiment of the present invention. These components may be formed as a part of a processing structure or bowl. Specifically, the acoustic energy treatment apparatus 200 may be movably (or non-movably) coupled to the processing structure or bowl and the flat article 50 may be positioned within the processing structure or bowl. Thus, the acoustic energy treatment apparatus 200 may be deemed to be in a gaseous, as opposed to an underwater, environment. An example of such a processing structure or bowl is illustrated and described in U.S. Pat. No. 7,784,478, issued on Aug. 31, 2010, the entirety of which is incorporated herein by reference.

The acoustic energy treatment apparatus 200 comprises a support arm 201 and a plurality of transducer assemblies (not illustrated in FIG. 2, but described in detail below with reference to FIGS. 3-8) coupled thereto. The support arm 201, in the exemplified embodiment, is an elongated member that is positioned over top of the first surface 51 of the flat article 50 in a cantilevered manner. However, the invention is not to be so limited in all embodiments and the support arm 201 can be any structure to which transducer assemblies are operably coupled. Thus, the support arm 201 may be a cantilevered structure supported at one end as depicted herein. Alternatively, the support arm 201 may be a structure that is supported from above. Furthermore, the support arm 201 may be an elongated structure as depicted herein, or the support arm 201 may be rectangular, square, circular, pyramidal, or the like in other embodiments. In its broadest sense, the term support arm can refer to any structure that supports the transducer assemblies and fluidly couples the transducer assemblies to the flat article 50, as discussed herein below, regardless of the particular shape of the support arm and regardless of the manner in which the support arm is held into position during processing.

As discussed in more detail below, the support arm 201 may in some embodiments be movable in a linear or rotational/arcuate manner relative to the first surface 51 of the flat article 50. Specifically, an end of the acoustic energy treatment apparatus 200 that is not positioned over the flat article 50 may form the rotational axis R-R about which the support arm 201 may move in a rotational manner. Alternatively the entire acoustic energy treatment apparatus 200 may move in a linear manner back and forth across the flat article 50 (as indicated by the arrow U). Furthermore, in the exemplified embodiment the support arm 201 extends across the flat article 50 a distance that is slightly greater than the radius of the flat article 50. However, the invention is not to be so limited and in certain other embodiments the support arm 201 may extend across the entire diameter of the flat article 50, or the support arm 201 may extend exactly to the center-point of the flat article 50, or the support arm 201 may extend slightly less than the radius of the flat article 50. Thus, the exact length of the support arm 201 relative to the flat article 50 is not to be limiting in all embodiments. However, it is preferable that the support arm 201 have transducer assemblies coupled thereto that are capable of applying acoustic energy to most or the entirety of the first surface 51 of the flat article 50 as the flat article 50 rotates.

As noted above, in the exemplified embodiment the support arm 201 has an elongated rod-like shape. However, the invention is not to be so limited and it should be appreciated that the support arm 201 can take on any other desired shape such as being a flat plate, triangular shaped, diamond shaped, other polygonal shaped, or the like. In certain embodiments the support arm 201 may be hollow and the transducers may be located within the hollow interior of the support arm 201. In other embodiments the support arm 201 may be a solid structure and the transducers may be coupled to a top surface, a bottom surface or side surfaces of the support arm 201. As noted above, the support arm 201 can be cantilevered as depicted herein, supported from its top end, or positioned and held over the flat article 50 in any other manner. The support arm 201 is not limiting in shape unless specifically recited in the claims, but rather the support arm 201 can be any structure that supports the transducers as described herein below.

Referring now to FIGS. 3, 4, 5A, 5B, and 7-10 concurrently, the acoustic energy treatment apparatus 200 will be further described. The acoustic energy treatment apparatus 200 comprises the support arm 201 extending along a first longitudinal axis A-A from a proximal end 202 to a distal end 203. The support arm 201 has a top surface 205 and an opposing bottom surface 206. The support arm 201 of the acoustic energy treatment apparatus 200 is the structure that supports the transducer assemblies that generate acoustic energy and the dispensing mechanism that dispenses liquid onto the flat article 50 as noted herein above. In the exemplified embodiment, the support arm 201 extends from a body 204 of the acoustic energy treatment apparatus 200 in a cantilevered manner along the first longitudinal axis A-A. Thus, during use the support arm 201 can be cantilevered above the flat article 50 to dispense the liquid onto the flat article 50 and to generate acoustic energy onto the flat article 50. The body 204 and the support arm 201 of the acoustic energy treatment apparatus 200 comprise the necessary passageways to enable wiring, fluids (i.e., liquid and gas), and the like to pass into and through the support arm 201 to make any necessary electrical connections and to flow liquid and/or gas through the support arm 201 as described herein below.

In the exemplified embodiment, the acoustic energy treatment apparatus 200 comprises a plurality of first transducer assemblies 210 coupled to the support arm 201 and a plurality of second transducer assemblies 230 coupled to the support arm 201. More specifically, in the exemplified embodiment the bottom surface 206 of the support arm 201 has a first elongated recess 207 formed therein and a second elongated recess 208 formed therein, the first and second elongated recesses 207, 208 being elongated in the direction of the longitudinal axis A-A. Each of the first and second elongated recesses 207, 208 is a concave depression formed into the bottom surface 206 of the support arm 201 having a half-circle shaped transverse cross-sectional profile. Furthermore, in the exemplified embodiment the first elongated recess 207 is located on a first side of the longitudinal axis A-A and the second elongated recess 208 is located on a second side of the longitudinal axis A-A. However, the invention is not to be so limited and each of the first and second elongated recesses 207, 208 may be located on the same side of the longitudinal axis A-A in other embodiments.

Furthermore, the plurality of first transducer assemblies 210 are coupled to the support arm 201 and at least partially positioned within the first elongated recess 207 and the plurality of second transducer assemblies 230 are coupled to the support arm 201 and at least partially positioned within the second elongated recess 208. Of course, the recesses 207, 208 may be omitted in some embodiments and the first and second transducer assemblies 210, 230 can be coupled to the support arm 201 without being located within the recesses 207, 208. Furthermore, in some embodiments only one elongated recess may be included with the other being omitted, such as when the acoustic energy treatment apparatus 200 only includes the first transducer assemblies 210 but not also the second transducer assemblies 230.

In the exemplified embodiment, the plurality of first transducer assemblies 210 are positioned along a second longitudinal axis B-B and the plurality of second transducer assemblies 230 are positioned along a third longitudinal axis C-C. In the exemplified embodiment, the second longitudinal axis B-B (and hence also the plurality of first transducer assemblies 210) are positioned on a first side of the longitudinal axis A-A of the support arm 201 and the third longitudinal axis C-C (and hence also the plurality of second transducer assemblies 230) are positioned on a second side of the longitudinal axis A-A of the support arm 201. However, the invention is not to be so limited and the plurality of first and second transducer assemblies 210, 230 may both be positioned on the same side of the longitudinal axis A-A in some embodiments. In the exemplified embodiment, the first, second, and third longitudinal axes A-A, B-B, C-C are parallel to one another. However, the invention is not to be so limited in all embodiments and the first, second, and third longitudinal axes A-A, B-B, C-C may be non-parallel in other embodiments, such as embodiments wherein the support arm 201 is wedge-shaped or the like. Furthermore, in certain embodiments the acoustic energy treatment apparatus 200 may comprise either the plurality of first transducer assemblies 210 or the plurality of second transducer assemblies 230, but not both. In still other embodiments, the acoustic energy treatment apparatus 200 may include additional transducer assemblies in addition to the plurality of first and second transducer assemblies 210, 230 (such as a plurality of third transducer assemblies, and so on).

In the exemplified embodiment, the plurality of first transducer assemblies 210 comprises five distinct first transducer assemblies 210. Of course, more or less than five transducer assemblies 210 can be used in other embodiments as desired. Furthermore, each of the first transducer assemblies 210 comprises a first housing 211, a first transducer 212 acoustically coupled to the first housing 211, and a first shell 213. In the exemplified embodiment, each of the first transducer assemblies 210 has the same components and structure. For simplicity, and with reference to FIGS. 5A, 5B, 6A, 6B, and 7 concurrently, the details of one of the first transducer assemblies 210 will be described, it being understood that the other of the first transducers assemblies 210 has identical components and an identical structure. Thus, although one of the first housings 211, one of the first transducers 212, and one of the first shells 213 will be described below, it should be appreciated that the description is equally applicable to each of the first housings 211, each of the first transducers 212, and each of the first shells 213.

Figures 6A, 6B:
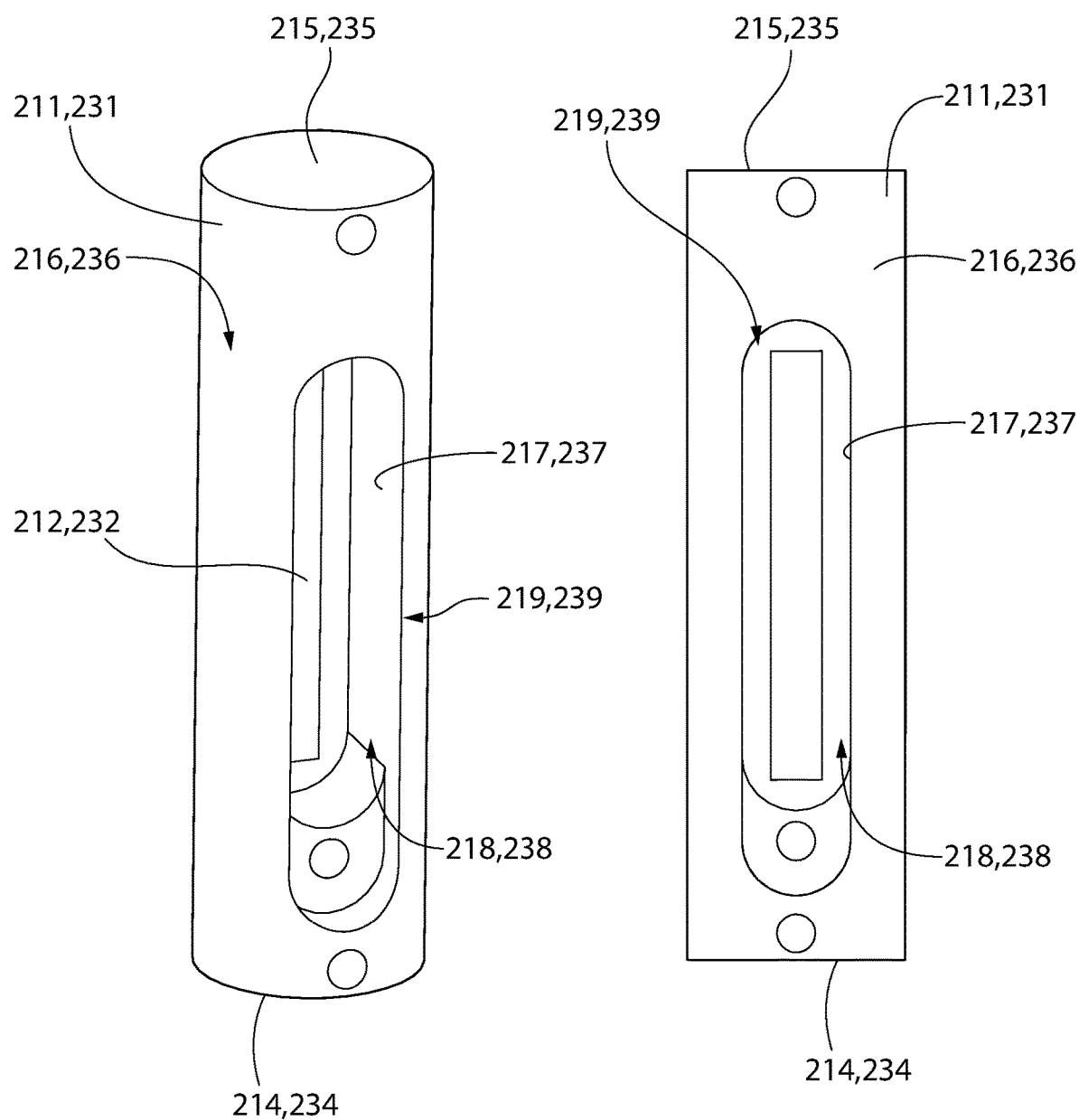
FIG. 6A is a perspective view of a transducer assembly in accordance with an embodiment of the present invention.
FIG. 6B is a top view of the transducer assembly of FIG. 6A.

The first housing 211 of the first transducer assemblies 210 is a cylindrical housing extending from a first end 214 to a second end 215. In the exemplified embodiment, the first housing 211 is formed of metal (such as aluminum or the like), although other materials can be used so long as acoustic energy generated by the first transducer 212 is emitted through first housing 211. Furthermore, the first housing 211 of the first transducer assemblies 210 has an outer surface 216 and an inner surface 217 that defines a cavity 218. An opening 219 is formed into the outer surface 216 of the first housing 211 that forms a passageway from the outer surface 216 into the cavity 218. In the exemplified embodiment the opening 219 is elongated along the length of the first housing 211. The first transducer 212 is coupled to the first housing 211 within the cavity 218 and at a location between the first and second ends 214, 215 of the first housing 211. Although the first transducer 212 is entirely located within the cavity 218 in the exemplified embodiment, the first transducer 212 remains exposed through the opening 219. As seen in FIGS. 6A and 6B, the first transducer 212 is visible through the opening 219. In certain embodiments, the first housing 211 is between 1 and 2 inches long, more specifically between 1.3 and 1.7 inches long, and more specifically approximately 1.6 inches long (measured between the first and second ends 214, 215).

In the exemplified embodiment, exactly one of the first transducers 212 is positioned within each one of the first housings 211. Having a single one of the first transducers 212 positioned within each one of the first housings 211 increases the control of the first transducer 212 with regard to the angle and frequency of acoustic energy transmission, the positioning of the first transducer 212, and the powering sequence and phase of the first transducer 212. Of course, the invention is not to be so limited in all embodiments and in certain other embodiments each of the housings 211 may have more than one of the first transducers 212 positioned therein.

Furthermore, in the exemplified embodiment the cavity 218 of the first housing 211 comprises vertical sidewalls and a planar floor (see FIGS. 12 and 14), and the first transducer 212 positioned within the cavity 218 is located on the floor of the cavity 218. Thus, in the exemplified embodiment the first transducer 212 has a flat, planar bottom surface that is in surface contact with the floor of the cavity 218. Of course, the invention is not to be so limited in all embodiments and the inner surface 217 of the first housing 211 may have a concave shape and the first transducer 212 may have a shape that corresponds with the shape of the inner surface 217 of the first housing 211 (i.e., a convex shape that corresponds with the concave shape of the inner surface 217 of the first housing 211) to ensure adequate acoustic coupling between the first transducer 212 and the first housing 211 so that the first housing 211 can operate as an acoustical transmitter (i.e., the acoustic energy of the first transducer 212 transmits through the first housing 211 within which the first transducer 212 is located). Thus, the invention is not intended to be limited by the shape of the cavity 218 and the shape of the first transducers 212 in all embodiments.

In the exemplified embodiment, the first shell 213 is a tubular structure having a hollow interior cavity. Furthermore, when assembled the first housing 211 is positioned within the first shell 213 and the first transducer 212 within the first housing 211 is acoustically coupled to the first shell 213 so that acoustical energy generated by the first transducer 212 transmits through the first shell 213 and onto the flat article 50. In the exemplified embodiment, each of the first housings 211 is located within a separate and distinct first shell 213. However, the invention is not to be so limited and the first shell 213 may be a single, unitary elongated structure having a hollow interior cavity such that the first shell may house all of the first housings 211 of the plurality of first transducer assemblies 210. The first shell 213, as noted above, may be formed of a non-reactive material such as FEP or PFA tubing so that the first shell 213 does not react with any of the chemicals used during processing to avoid potential contamination of the flat article 50. Specifically, in the exemplified embodiment the first shell 213 forms the exterior of the first transducer assemblies 210 and thus it is the first shell 213 that is in contact with the liquid dispensed onto the flat article 50 during processing. Therefore, forming the first shell 213 out of a non-reactive material ensures that no reaction takes place between the first shell 213 and the liquid which could negatively affect cleaning and processing of the flat articles 50. Of course, in certain embodiments the first shell 213 may be omitted and the first housings 211 and the first transducers 212 may together form the first transducer assemblies 210.

Furthermore, in the exemplified embodiment an air inlet fitting 221 is coupled to each of the first shells 213. In the exemplified embodiment, the air inlet fitting 221 is formed of plastic and defines a passageway 222 (see FIG. 14) for the passage of air/gas therethrough. Of course, the air inlet fitting 221 can be formed of other materials, such as metal, wood, or the like. The air inlet fitting 221 extends through the first shells 213 thereby forming a passageway from the external environment into the hollow interior of the first shells 213. In certain embodiments, the air inlet fittings 221 are aligned with the openings 219 in the first housings 211 so that the air inlet fittings 221 form a passageway from exterior of the first shells 213 into the cavity 218 of the first housings 211. Thus, the air inlet fittings 221 provide a passageway for air to flow from the exterior into the cavity 218 for cooling of the first transducers 212 located within the cavities 218 of the first housings 211. In certain embodiments, the air inlet fittings 221 may be omitted and mere openings in the first shells 213 may provide a sufficient passageway for the flow of air to cool the transducers 212 as disclosed herein.

In the exemplified embodiment, the plurality of second transducer assemblies 230 comprises four distinct second transducer assemblies 230. Of course, more or less than four second transducer assemblies 230 can be used in other embodiments as desired. Furthermore, each of the second transducer assemblies 230 comprises a second housing 231, a second transducer 232 acoustically coupled to the second housing 231, and a second shell 233. In the exemplified embodiment, each of the second transducer assemblies 230 has the same components and structure. For simplicity, and with reference to FIGS. 5A, 5B, 6A, 6B, and 7 concurrently, the details of one of the second transducer assemblies 230 will be described, it being understood that the other of the second transducers assemblies 230 has identical components and an identical structure. Thus, although one of the second housings 231, one of the second transducers 232, and one of the second shells 233 will be described below, it should be appreciated that the description is equally applicable to each of the second housings 231, each of the second transducers 232, and each of the second shells 233.

The second housing 231 of the second transducer assemblies 230 is a cylindrical housing extending from a first end 234 to a second end 235. In the exemplified embodiment, the second housing 231 is formed of metal, although other materials can be used so long as acoustic energy generated by the second transducer 232 is emitted through second housing 231. Furthermore, the second housing 231 of the second transducer assemblies 230 has an outer surface 236 and an inner surface 237 that defines a cavity 238. An opening 239 is formed into the outer surface 236 of the second housing 231 that forms a passageway from the outer surface 236 into the cavity 238. In the exemplified embodiment the opening 239 is elongated along the length of the second housing 231. The second transducer 232 is coupled to the second housing 231 within the cavity 238 and at a location between the first and second ends 234, 235 of the second housing 231. The description of the shape of the cavity 218 of the first housing 211 and the first transducers 212 is equally applicable to the shape of the cavity 238 of the second housings 231 and the second transducers 232 and will not be repeated here in the interest of brevity. Although the second transducer 232 is entirely located within the cavity 238 in the exemplified embodiment, the second transducer 232 remains exposed through the opening 239. As seen in FIGS. 6A and 6B, the second transducer 232 is visible through the opening 239. In certain embodiments, the second housing 231 is between 1 and 2 inches long, more specifically between 1.3 and 1.7 inches long, and more specifically approximately 1.6 inches long (measured between the first and second ends 214, 215).

In the exemplified embodiment, exactly one of the second transducers 232 is positioned within each one of the second housings 231. Having a single one of the second transducers 232 positioned within each one of the second housings 231 increases the control of the second transducer 232 with regard to the angle and frequency of acoustic energy transmission, the positioning of the second transducer 232, and the powering sequence and phase of the second transducer 232. Of course, the invention is not to be so limited in all embodiments and in certain other embodiments each of the second housings 231 may have more than one of the second transducers 232 positioned therein.

In the exemplified embodiment, the second shell 233 is a tubular structure having a hollow interior cavity. Furthermore, when assembled the second housing 231 is positioned within the second shell 233. Moreover, when assembled the second transducer 232 within the second housing 231 is acoustically coupled to the second shell 233 so that acoustical energy generated by the second transducer 232 transmits through the second shell 233 and onto the flat article 50. In the exemplified embodiment, each of the second housings 231 is located within a separate and distinct second shell 233. However, the invention is not to be so limited and the second shell 233 may be a single, unitary elongated structure having a hollow interior cavity such that the second shell 233 may house all of the second housings 231 of the second of first transducer assemblies 230. The second shell 233, as noted above, may be formed of a non-reactive material such as PFA tubing so that the second shell 233 does not react with any of the chemicals used during processing. Specifically, in the exemplified embodiment the second shell 233 forms the exterior of the second transducer assemblies 230 and thus it is the second shell 233 that is in contact with the liquid dispensed onto the flat article 50 during processing. Therefore, forming the second shell 233 out of a non-reactive material ensures that no reaction takes place between the first transmitter 233 and the liquid which could negatively affect cleaning and processing of the flat articles 50. Of course, in certain embodiments the second shell 233 may be omitted.

Furthermore, in the exemplified embodiment an air inlet fitting 241 is coupled to each of the second transmitters 233. In the exemplified embodiment, the air inlet fitting 241 is formed of metal and defines a passageway 242 (see FIG. 14) for the passage of fluid, and particularly air/gas, therethrough. Of course, the air inlet fitting 241 can be formed of other materials, such as plastic, wood, or the like. The air inlet fitting 241 extends through the second transmitters 233 thereby forming a passageway from the external environment into the hollow interior of the second transmitters 233. In certain embodiments, the air inlet fittings 241 are aligned with the openings 239 in the second housings 231 so that the air inlet fittings 241 form a passageway from exterior of the second transmitters 233 into the cavity 238 of the second housings 231. Thus, the air inlet fittings 241 provide a passageway for air to flow from the exterior into the cavity 238 for cooling of the second transducers 232 located within the cavities 238 of the second housings 231. In certain embodiments, the air inlet fittings 241 may be omitted and mere openings in the second transmitters 233 may provide a sufficient passageway for the flow of air to cool the transducers 232 as disclosed herein.

In the exemplified embodiment each of the plurality of first transducer assemblies 210 (and each of the first housings 211) is positioned adjacent to one another in an end-to-end manner along the second longitudinal axis B-B. Thus, the first end 214 of a first one of the first housings 211 is positioned adjacent to the second end 215 of a second one of the first housings 211, and so on. Similarly, each of the plurality of second transducer assemblies 230 (and each of the second housings 231) is positioned adjacent to one another in an end-to-end manner along the third longitudinal axis C-C. Thus, the first end 234 of a first one of the second housings 231 is positioned adjacent to the second end 235 of a second one of the second housings 231, and so on. Thus, the adjacent housings 211, 231 are abutted in an end-to-end manner.

Furthermore, in the exemplified embodiment the first and second transducer assemblies 210, 230 are positioned on opposing sides of the first longitudinal axis A-A of the support arm 201 in a staggered arrangement. Thus, referring to FIG. 7, the first end 234 of a first one of the second housings 231 is transversely aligned with a first one of the first housings 211 at a location between the first and second ends 214, 215 of the first one of the first housings 211. Furthermore, the second end 235 of the first one of the second housings 231 is transversely aligned with a second one of the first housings 211 at a location between the first and second ends 214, 215 of the second one of the first housings 211. This same arrangement/configuration is true for each pair of first and second housings 211, 231. Of course, the invention is not to be so limited in all embodiments and in certain embodiments the plurality of first transducer assemblies 210 (and the corresponding first housings 211) and the plurality of second transducer assemblies 230 (and the corresponding second housings 231) may be transversely aligned along the first longitudinal axis A-A without staggering. In some embodiments there may be no overlap between the plurality of first transducer assemblies 210 and the plurality of second transducer assemblies 230 and each of the first transducer assemblies 210 may be transversely aligned only with a gap between adjacent ones of the second transducer assemblies 230 and vice versa. Thus, various permutations for the positioning and arrangement of the plurality of first and second transducer assemblies 210 is within the scope of the present invention.

Referring briefly to FIGS. 9 and 16a-c, in certain embodiments each of the first transducers 212 and each of the second transducers 232 is oriented to generate acoustic energy at a non-normal angle $\Theta$ relative to the surface 51 of the flat article 50. Thus, the first and second housings 211, 231 are coupled to the support arm 201 in a manner such that the first and second transducers 212, 232 do not face directly downward onto the surface 51 of the flat article 50. In certain embodiments, each of the first and second transducers 212, 232 is oriented at plus or minus 15° relative to the normal axis extending from the first and second housings 211, 231 to the surface 51 of the flat article 50, which results in the non-normal angle $\Theta$ being between 75° and 105° in certain embodiments. However, the angle at which the first and second transducers 212, 232 are oriented to generate the acoustic energy onto the surface 51 of the flat article 50 can be any desired angle and can be changed by rotating the housings 211, 231 about their longitudinal axes. The angle at which the first and second transducers 212, 232 are oriented relative to the surface 51 of the flat article 50 may be manually adjustable in certain embodiments, such as by forming slots in the housings with incremental stop positions, automatically adjustable via a process recipe stored in the controller 12 as discussed in more detail below, or in any other manner as would be readily appreciated by those of ordinary skill in the art.

Figure 16A:
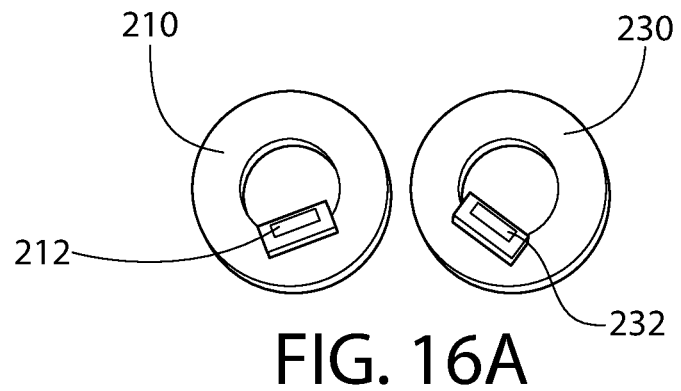
FIGS. 16a-c are schematic illustrations of alternative arrangements of the transducer assemblies to generate acoustic energy at different angles.
Figure 16B:
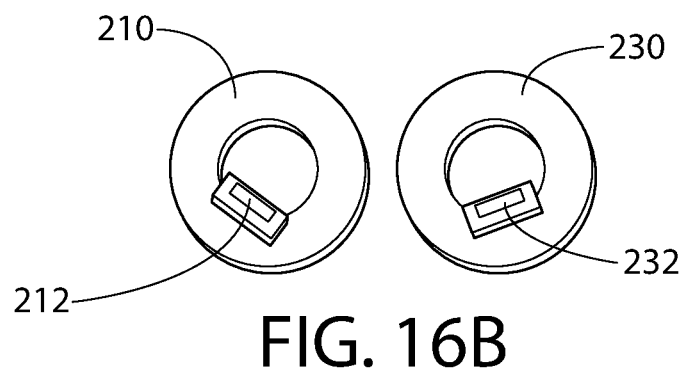
Figure 16C:
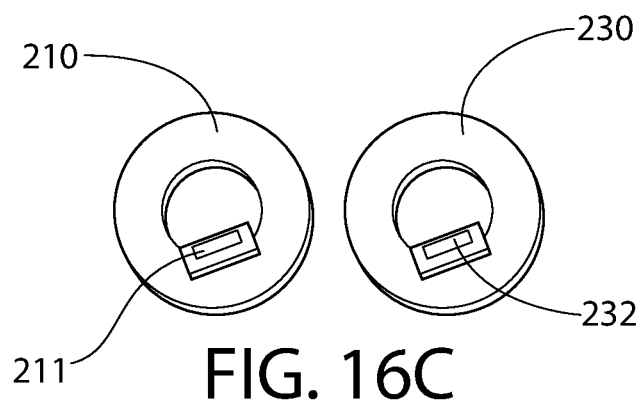

FIGS. 16a-c illustrate some exemplary schematic illustrations of the angles at which the first transducers 212 and the second transducers 232 may be oriented relative to the surface 51 of the flat article 50. In FIG. 16a, the first and second transducers 212, 232 are oriented in a mirror image arrangement. Specifically, in FIG. 16a each of the first and second transducers 212, 232 is oriented to generate acoustic energy onto the flat article 50 at a non-normal angle such that the first and second transducers 212, 232 generate the acoustic energy in a direction towards each other. Thus, in this embodiment the first and second transducers 212, 232 generate acoustic energy in opposite directions towards one another. In FIG. 16b, the first and second transducers 212, 232 are oriented in a symmetric arrangement. Specifically, in FIG. 16a each of the first and second transducers 212, 232 is oriented to generate acoustic energy onto the flat article at a non-normal angle such that the first and second transducers 212, 232 generate the acoustic energy in a direction away from each other. Thus, in this embodiment the first and second transducers 212, 232 generate acoustic energy in opposite directions away from one another. In FIG. 16c, the first and second transducers 212, 232 are oriented in an asymmetric arrangement. Specifically, the first and second transducers 212, 232 generate the acoustic energy in the same direction relative to the flat article 50. Various permutations of the angles at which each of the first and second transducers 212, 232 transmits acoustic energy onto the flat article 50 are possible, some of which are discussed herein.

Still referring to FIGS. 9 and 16a-c, in certain embodiments each of the first transducers 212 may be oriented in the same manner so that each of the first transducers 212 generates acoustic energy onto the flat article 50 at the same angle. Furthermore, in certain embodiments each of the second transducers 232 may be oriented in the same manner so that each of the second transducers 232 generates acoustic energy onto the flat article 50 at the same angle. However, the invention is not to be so limited and in certain embodiments some of the first transducers 212 and/or some of the second transducers 232 may be oriented to generate acoustic energy onto the surface 51 of the flat article 50 at different angles relative to one another. More specifically, in certain embodiments a first one of the first transducers 212 may be oriented to generate acoustic energy onto the surface 51 of the flat article 50 at a first non-normal angle and a second one of the first transducers 212 may be oriented to generate acoustic energy onto the surface 51 of the flat article 50 at a second non-normal angle, the first and second non-normal angles being different from one another. Thus, in certain embodiments a plurality of the first transducers 212 are aligned along the second longitudinal axis B-B and are oriented to generate acoustic energy that contacts the surface 51 of the flat article 50 at different angles relative to each other. In certain embodiments each of the first transducers 212 may be oriented to generate acoustic energy at a different angle relative to the flat article 50 than each of the other first transducers 212. The same possibilities are available for the second transducers 232 as well. Thus, even within each of the first and second plurality of transducer assemblies 210, 230, the acoustic energy may be generated so as to contact the flat article at different angles if so desired. This is made possible by housing a single one of the first transducers 212 within each one of the first housings 211 and a single one of the second transducers 232 within each one of the second housings 231.

In certain embodiments, each of the first and second transducer assemblies 210, 230 is independently coupled to the support arm 201 so that each of the first transducer assemblies 210 and each of the second transducer assemblies 230 can be oriented in a desired manner. Stated another way, in certain embodiments each of the first housings 211 and each of the second housings 231 may be independently coupled to the support arm 201. Thus, in such embodiments each of the first housings 211 and each of the second housings 212 may be independently and separately rotatable about its own longitudinal axis and relative to the support arm 201 to change the angle at which the first and second transducers 212, 232 coupled to the first and second housings 211, 212 generates the acoustic energy relative to the flat article 50.

Furthermore, in some embodiments an actuator (such as the actuator 90) may be coupled, in an independent manner, to each of the first housings 211 and each of the second housings 231 (or to each of the first transducer assemblies 210 and each of the second transducer assemblies 230) so that the actuator 90 can adjust the positioning of each of the housings 211, 231 before, during, or after processing. In such embodiments, the controller 12 may be coupled to the actuator 90 and the controller 12 may be configured to independently move each of the first housings 211 relative to the surface 51 of the flat article 50 between: (1) a first position in which the first transducer 212 of the first housing 211 is oriented to generate acoustic energy at a first non-normal angle relative to the surface 51 of the flat article 50; and (2) a second position in which the first transducer 212 of the first housing 211 is oriented to generate acoustic energy at a second non-normal angle relative to the surface 51 of the flat article 50, the first and second non-normal angles being different. Of course, the controller 12 may also be configured to independently move each of the second housings 231 relative to the surface 51 of the flat article 50 between different first and second positions as well.

In certain embodiments, moving the first housings 211 between the first and second positions comprises rotating the first housings 211 about the second longitudinal axis B-B and moving the second housings 232 between the first and second positions comprises rotating the second housings 232 about the third longitudinal axis C-C. In some embodiments the entire first and second transducer assemblies 210, 230, including the first and second shells 213, 233 and the first and second housings 211, 231, are moved between the first and second positions. Thus, the first and second housings 211, 231 may be moved while the first and second shells 213, 233 remain static, or both the housings 211, 231 and the shells 213, 233 may move in tandem. The positioning of the first and second housings 211, 231 (and hence also the angle at which the acoustic energy is emitted onto the surface 51 of the flat article 50) can be changed dynamically as a part of the process recipe stored in the memory of the controller 12, or it can be changed manually by a user before, during, or after processing.

Due to the independent coupling between each of the housings 211, 231 and the support arm 201, the controller 12 may be configured to adjust the relative position of a single one of the housings 211, 231 or a single one of the transducer assemblies 210, 230 without altering the relative position of the other ones of the housings 211, 231 or the other ones of the transducer assemblies 230. Alternatively, the controller 12 may adjust the relative positions of a group of the housings 211, 231 or all of the housings 211, 231 simultaneously if desired. Stated simply, each of the housings 211, 231 is independently adjustable or movable without adjusting or moving any of the other housings 211, 231, and thus the angle at which each of the transducers 212, 232 transmits the acoustic energy onto the flat article 50 can be adjusted without adjusting the angle at which the other transducers 212, 232 transmits the acoustic energy onto the flat article 50. Thus, by coupling a single transducer 212, 232 within an individual housing 211, 231, the acoustic energy generation angle can be adjusted with respect to a single one of the transducers 212, 232 or multiple of the transducers 212, 232 in an automated (or manual) fashion.

Thus, forming the acoustic energy treatment apparatus 200 with a plurality of first transducer assemblies 210 each of which comprises a separate and distinct housing 211 with a single first transducer 212 acoustically coupled thereto (and possibly also with a plurality of second transducer assemblies 230 each comprising a separate and distinct second housing 231 with a single second transducer 232 acoustically coupled thereto 232) allows for many variations with regard to acoustic energy transmission that was not previously possible. Because each transducer 212, 232 is acoustically coupled to its own housing 211, 231 and each of the housings 211, 231 is independently coupled to the support arm 201, the housings 211, 231 are separately movable relative to the flat article 50. Thus, rather than requiring all of the first transducers 212 to be moved together and to be oriented at the same angle relative to the flat article, each of the first transducers 212 can be moved separately and can be oriented at different angles relative to the flat article. The same goes for the second transducers 232 relative to one another and relative to the first transducers 212.

Figure 5A:
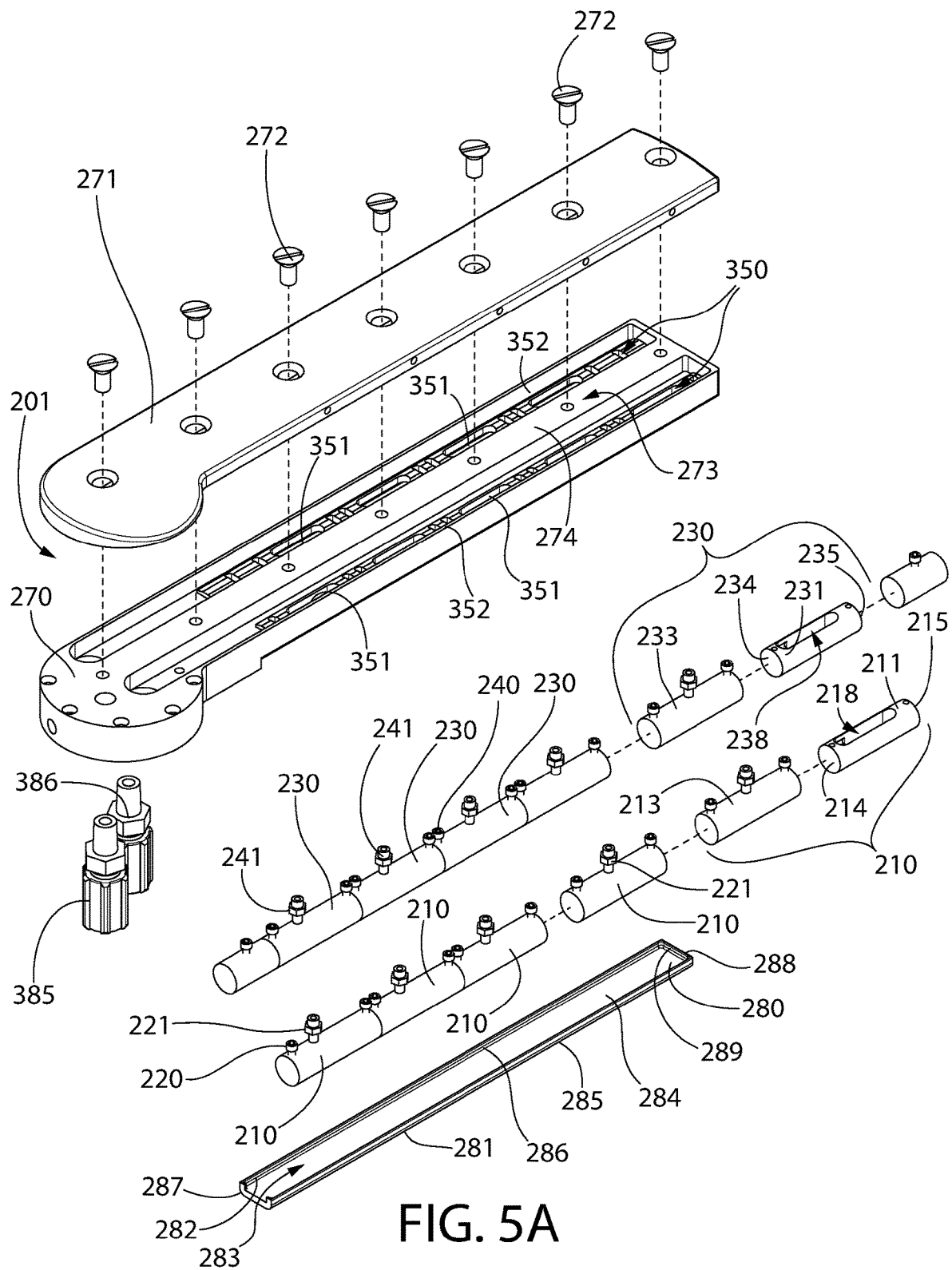
FIG. 5A is a top perspective exploded view of the acoustic energy treatment apparatus of FIG. 2.
Figure 5B:
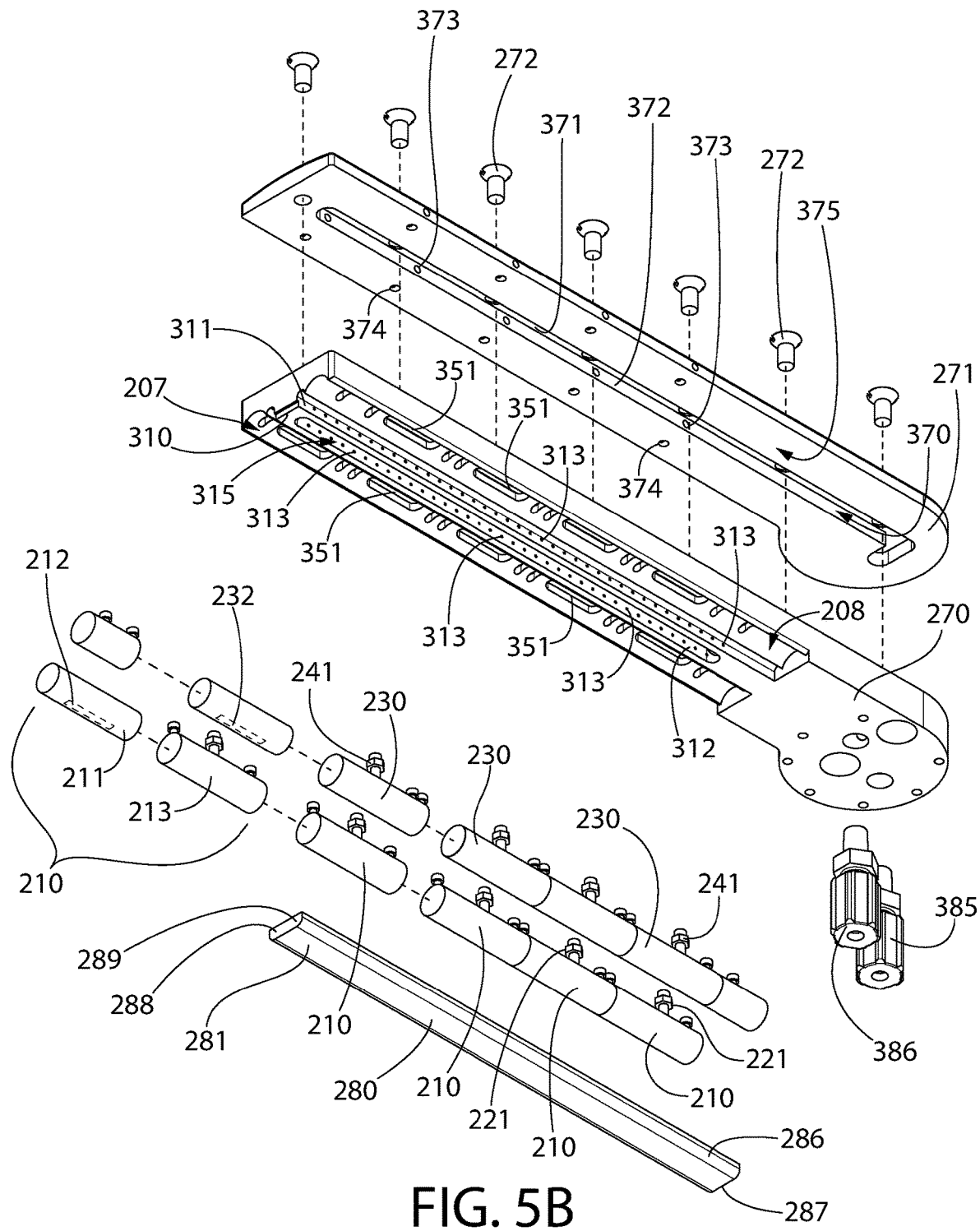
FIG. 5B is a bottom perspective exploded view of the acoustic energy treatment apparatus of FIG. 2.

Of course, although embodiments are described herein in which the housings 211, 231 are movable relative to the support arm 201, the invention is not to be so limited in all embodiments. Referring to FIGS. 5A and 5B, in certain embodiments each of the housings 211, 231 is separately coupled to the support arm 201 in a fixed position. Specifically, each of the first housings 211 may be coupled to the support arm 201 via one or more fasteners 220 such as screws or the like and each of the second housings 231 may be coupled to the support arm 201 via one or more fasteners 240 such as screws or the like. Only one of the fasteners 220 and one of the fasteners 240 is labeled in the drawings to avoid clutter. However, in certain embodiments even when fasteners 220, 240 are used, the first and second housings 211, 231 may be movable as described herein.

In addition to independent movement as described herein above, the inventive system may also have independent control of the frequency, powering sequence, and phase of each of the transducers 212, 232. In certain embodiments, the frequency of the transducers 212, 232 need not all be the same, and thus some of the transducers 212, 232 may operate at different frequencies than others of the transducers 212, 232. Furthermore, the power setting, on/off sequence, and phase of each of the transducers 212, 232 can be independent of the other transducers 212, 232. Thus, for example, some of the transducers 212, 232 may be powered and transmitting acoustic energy while others of the transducers 212, 232 are not powered and are not transmitting acoustic energy. Whether or not each of the transducers 212, 232 is powered and at what frequency may be a part of the process recipe that is stored in the memory of the controller 12 so that the transducers 212, 232 are automatically turned on and off and so that the power and frequency levels of the transducers 212, 232 may change automatically during processing. As one particular example, when the transducers 212, 232 are in the mirror image format depicted in FIG. 16a and described above, the first transducers 212 may be powered on while the second transducers 232 are powered off to avoid duplicating transmission of acoustic energy to the same area. Many other combinations of on/off, frequency, phase, and the like for the various transducers 212, 232 are possible using the concepts disclosed herein as would be appreciated by persons of ordinary skill in the art.

In certain embodiments the positioning of each one of the first and second transducers 212, 232 relative to the flat article 50 can be known such as by using a position sensor that is operably coupled to each of the first and second transducers 212, 232 and to the controller 12 so that if it is determined that one of the transducers 212, 232, if operating, would not transmit acoustic energy that would contact the flat article 50, that transducer 212, 232 can be powered off. Specifically, each of the first and second transducers 212, 232 can be individually deactivated when transmission of acoustic energy from that transducer 212, 232 would not contact the flat article 50. Thus, various ones of the transducers 212, 232 can be powered on and off in various sequences as the support arm 201 moves relative to the flat article 50 as has been described herein above.

Referring to FIGS. 3-5B, 7, and 9 concurrently, the acoustic energy treatment apparatus 200 will be further described. The support arm 201 of the acoustic energy treatment apparatus 200 comprises a main body 270 and a cover 271. The cover 271 is coupled to the main body 270 via a plurality of fasteners 272, only some of which are labeled in the drawings to avoid clutter. The fasteners 272 can be any type of device that is used to fixedly couple two distinct components to one another, such as screws, nails, adhesive, hook-and-loop, or the like. In other embodiments, the cover 271 and the main body 270 may be coupled together via mechanical means, such as interference fit, tight fit, lock and key, indent and detent, or the like.

The acoustic energy treatment apparatus 200 also comprises a trough 280 coupled to the support arm 201. Specifically, the trough 280 is coupled to the support arm 201 between the plurality of first transducer assemblies 210 and the plurality of second transducer assemblies 230. As noted above, in certain embodiments the plurality of second transducer assemblies 230 may be omitted, and in such embodiments the trough 280 may be coupled to the support arm 201 adjacent to the plurality of first transducer assemblies 210.

Figure 7:
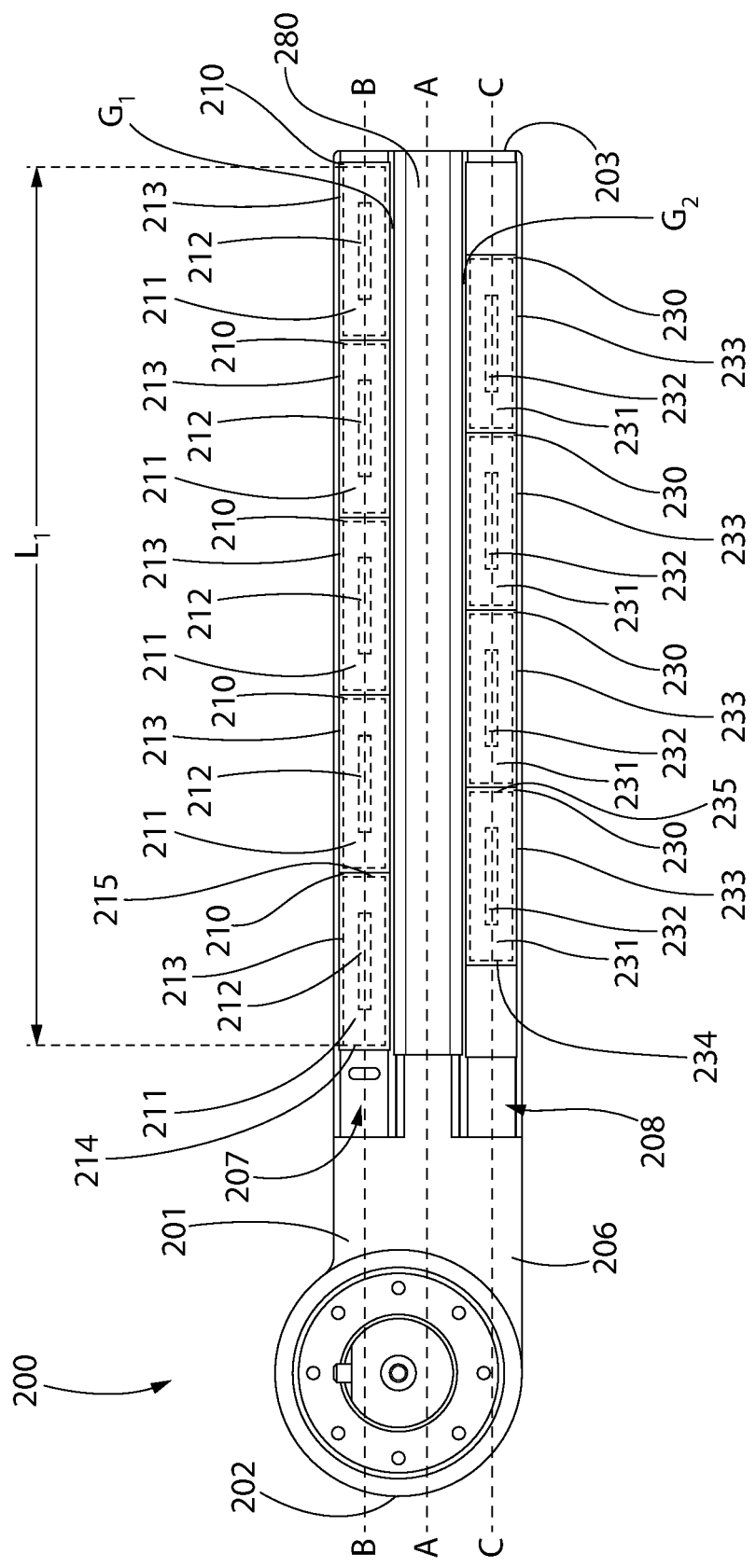
FIG. 7 is a bottom view of the acoustic energy treatment apparatus of FIG. 2.
Figure 8:
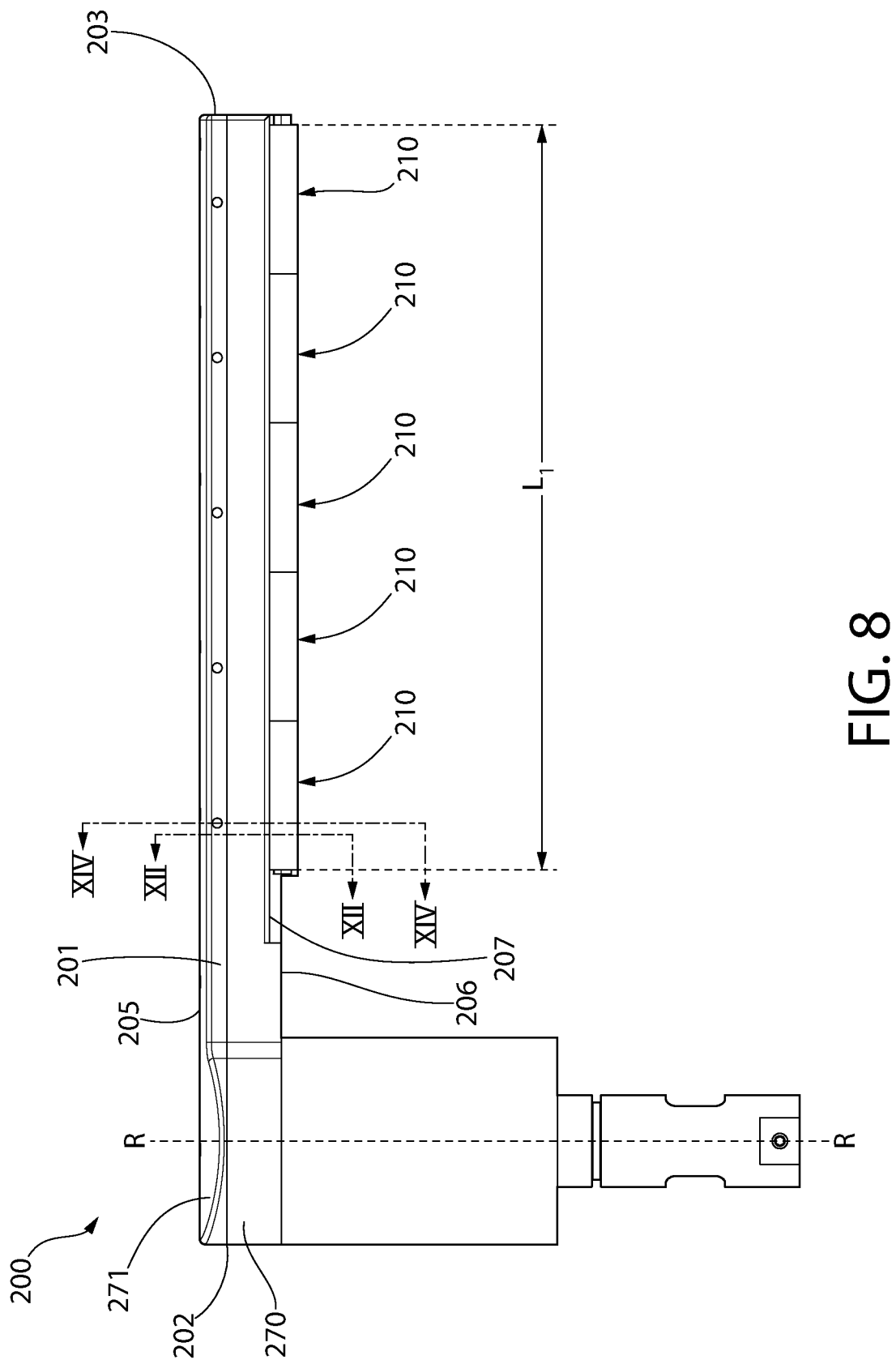
FIG. 8 is a side view of the acoustic energy treatment apparatus of FIG. 2.
Figure 9:
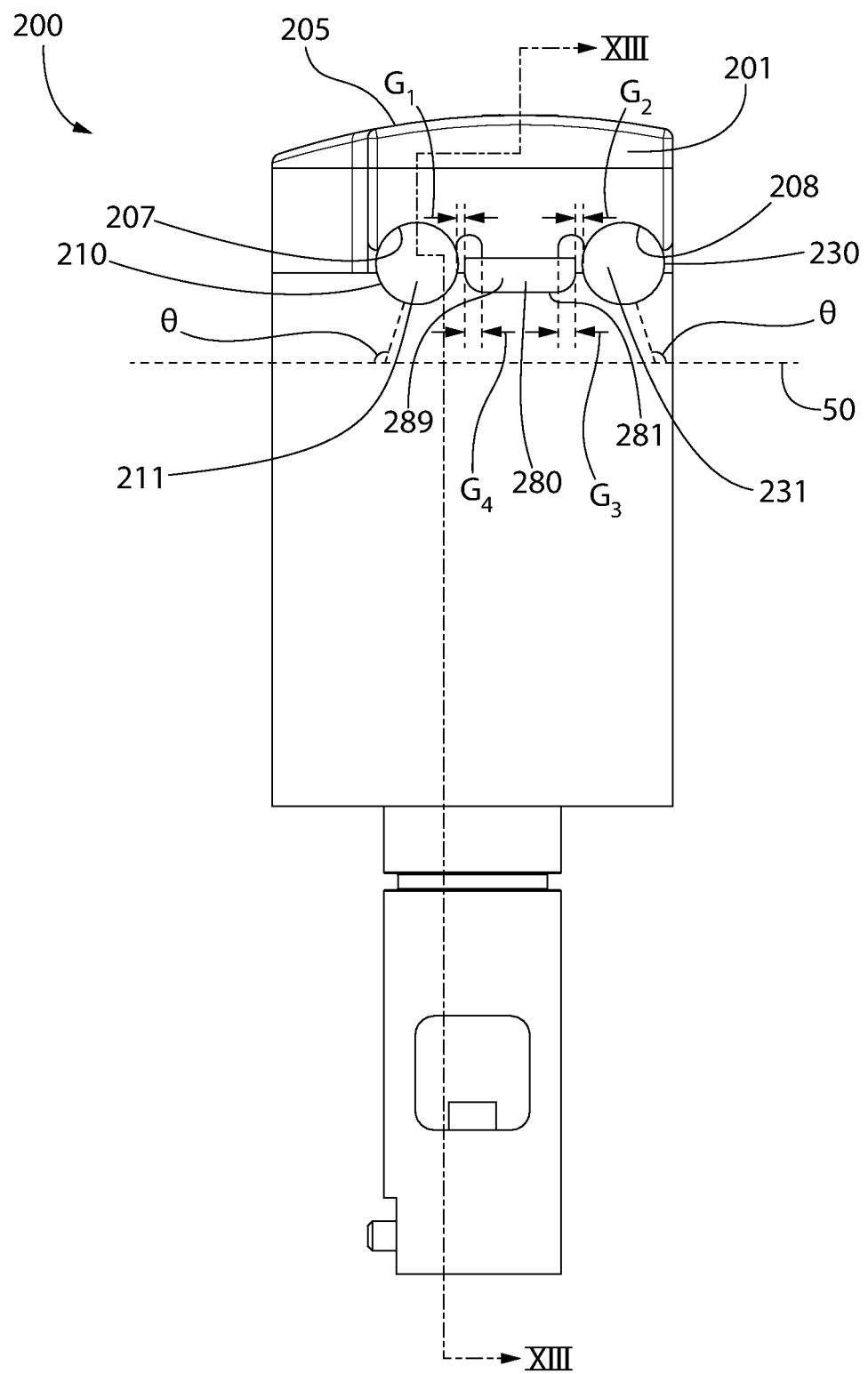
FIG. 9 is a front view of the acoustic energy treatment apparatus of FIG. 2.
Figure 10:
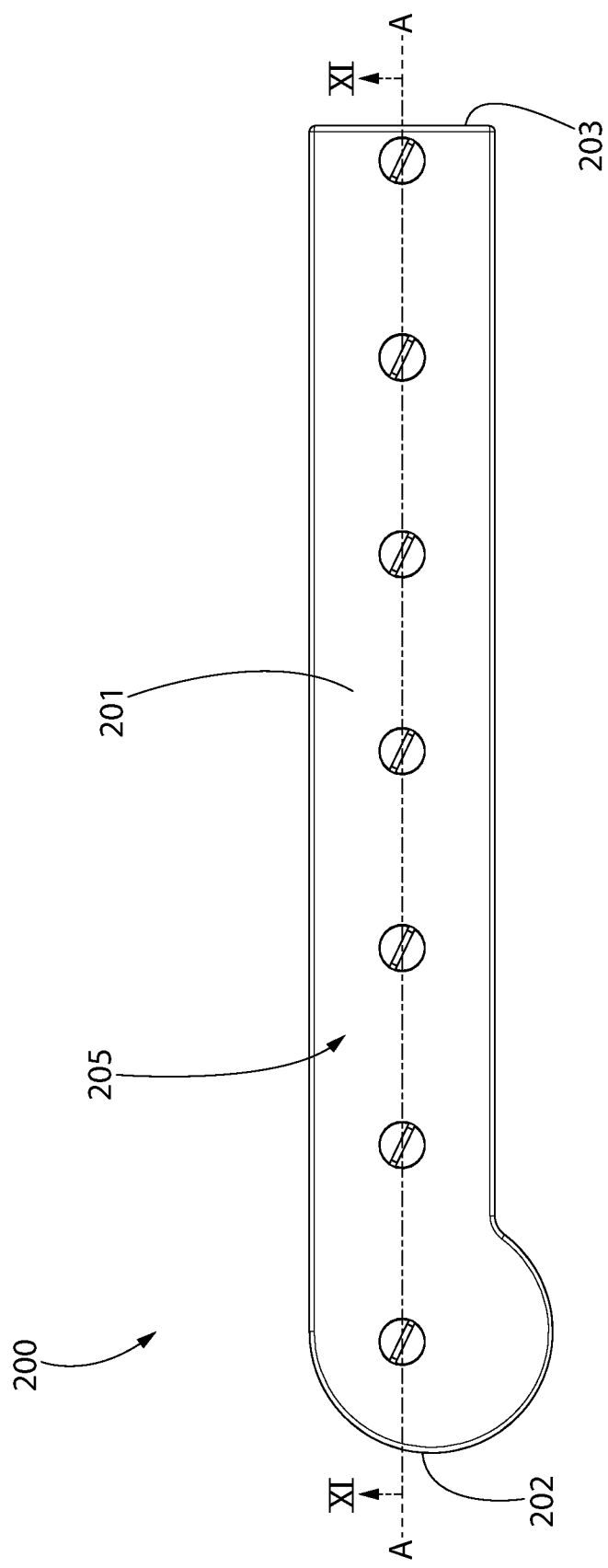
FIG. 10 is a top view of the acoustic energy treatment apparatus of FIG. 2.

In the exemplified embodiment, the plurality of first transducer assemblies 210 have a collective length $L_1$ measured along the second longitudinal axis B-B (measured from a first end of a first one of the first transducer assemblies 210 to a second end of a last one of the first transducer assemblies 210, see FIGS. 7 and 8). Furthermore, the trough 280 is coupled to the support arm 201 along at least a portion of the length $L_1$ of the plurality of first transducer assemblies 210. More specifically, in certain embodiments the trough 280 extends adjacent to the plurality of first transducer assemblies 210 (and between the plurality of first transducer assemblies 210 and the plurality of second transducer assemblies 230) for the entirety of the length $L_1$ of the plurality of first transducer assemblies 210 (and also for the entirety of the length of the plurality of second transducer assemblies 230, which in the exemplified embodiment is less than the length $L_1$ because there are fewer second transducer assemblies 230 than first transducer assemblies 210). The trough 280 is used as the mechanism through which the liquid is dispensed onto the surface 51 of the flat article 50. As will be appreciated from the discussion below, having the trough 280 extend along the entire length $L_1$ of the plurality of first and second transducer assemblies 210, 230 ensures an effective liquid coupling is achieved between each of the plurality of first transducer assemblies 210 and the flat article 50 and between each of the plurality of second transducer assemblies 230 and the flat article 50.

Referring now to FIGS. 5A, 5B, 9, 11, and 12, the trough 280 generally comprises an outer surface 281 and an inner surface 282 that defines a reservoir 283. Furthermore, the trough 280 comprises a floor 284, a first sidewall 285 extending upwardly from a first side of the floor 283, and a second sidewall 286 extending upwardly from a second side of the floor 284. The floor 284 and the first and second sidewalls 285, 286 of the trough 280 collectively define the reservoir 283. The trough 280 extends along the first longitudinal axis A-A from a first end 287 to a second end 288. Each of the floor 284 and the first and second sidewalls 285, 286 of the trough 280 are elongated along the longitudinal axis A-A. The first end 287 of the trough 280 is open and free of upwardly extending sidewalls. The second end 288 of the trough 280 is closed by an upstanding wall 289 that connects the first and second sidewalls 285, 286 at the second end 288 of the trough 280. Leaving the first end 287 of the trough 280 open enables liquid to enter into the trough 280 from the liquid supply subsystem 16 as will be described in greater detail below with reference to FIGS. 11 and 12.

The trough 280 is spaced apart from each of the first and second transducer assemblies 210, 230. Specifically, the outer surface 281 of the trough 280 is spaced apart from the first transducer assemblies 210 by a first gap $G_1$ and the outer surface 281 of the trough 280 is spaced apart from the second transducer assemblies 230 by a second gap $G_2$. Each of the first and second gaps $G_1$, $G_2$ is an elongated gap that extends the entirety of the collective length $L_1$ of the first transducer assemblies 210 (and the collective length of the second transducer assemblies 230). In certain embodiments, each of the first and second gaps $G_1$, $G_2$ is between 0.8 mm and 1.4 mm, more specifically between 1.0 mm and 1.2 mm, and still more specifically between 1.1 mm and 1.15 mm (or approximately 0.044 inches). As will be discussed in more detail below, when the liquid overflows the reservoir 283 of the trough 280, the liquid passes through the first and second gaps $G_1$, $G_2$ and comes into contact with the first and second transducer assemblies 210, 230 as the overflowing liquid flows downwardly towards the flat article 50. The dimensions of the first and second gaps $G_1$, $G_2$ provided above enhance the uniformity of the overflow of the liquid, as described in more detail below.

The main body 370 of the support arm 201 comprises a liquid manifold 310 formed therein that defines a liquid pathway 315 through the support arm 201. In the assembled apparatus, the liquid manifold 310 and portions of the liquid pathway 315 are aligned with the trough 280. Furthermore, as will be described in more detail below, the trough 280 forms a floor of the liquid manifold 310 to enclose the liquid pathway 315 and allow the liquid to flow through the support arm 201. The liquid manifold 310 is defined by a first wall 311 and a second wall 312. The first and second walls 311, 312 together form a closed polygonal boundary of the liquid manifold 310 in that the first and second walls 311, 312 are connected at the opposing ends of the liquid manifold 310. In the assembled apparatus with the trough 280 coupled to the support arm 201, each of the first and second walls 311, 312 of the liquid manifold 310 extends upwardly from the floor 284 of the trough 280. Thus, the first and second walls 311, 312 are in direct surface contact with the floor 284 of the trough 280 and extend upwardly therefrom. Each of the first and second walls 311, 312 is spaced inwardly from the first and second sidewalls 285, 286 of the trough 280. Specifically, the first wall 311 of the liquid manifold 310 is spaced apart from the first sidewall 285 of the trough 280 by a third gap $G_3$. Similarly, the second wall 312 of the liquid manifold 310 is spaced apart from the second sidewall 286 of the trough 280 by a fourth gap $G_4$.

A first portion 284a of the floor 284 of the trough 280 forms a floor of the liquid pathway 315. More specifically, the first portion 284a of the floor 284 of the trough 280 is located between the inner surfaces of the first and second walls 311, 312 of the liquid manifold 310. A second portion 284b of the floor 284 of the trough 280 is located between an outer surface of the first wall 311 of the liquid manifold 310 and the first sidewall 285 of the trough 280. A third portion 284c of the floor 284 of the trough 280 is located between an outer surface of the second wall 312 of the liquid manifold 310 and the second sidewall 286 of the trough 280. The first and second walls 311, 312 of the manifold 310 conceptually divide the liquid pathway 315 into a first portion 316, a second portion 317, and a third portion 318. Specifically, the first portion 316 of the liquid pathway 315 is defined between the first portion 284a of the floor 384 of the trough 380 and the inner surfaces of the first and second walls 311, 312 of the liquid manifold 310. The second portion 317 of the liquid pathway 315 is defined between the second portion 284b of the floor 284 of the trough 280, the outer surface of the first wall 311 of the liquid manifold 310, and the first sidewall 285 of the trough 280. The third portion 318 of the liquid pathway 315 is defined between the third portion 284c of the floor 284 of the trough 280, the outer surface of the second wall 312 of the liquid manifold 310, and the second sidewall 286 of the trough 280.

Each of the first, second, and third portions 316, 317, 318 of the liquid pathway 315 is capable of retaining the liquid therein. Specifically, due to the first and second walls 311, 312 of the liquid manifold 310 and the first and second sidewalls 285, 286 of the trough 280, reservoirs are defined in the first, second, and third portions 316, 317, 318 of the liquid pathway 315. As discussed in more detail below, the liquid flows into the first portion 316 of the liquid pathway 315, and then from the first portion 316 of the liquid pathway 315 into each of the second and third portions 317, 318 of the liquid pathway 315. Finally, the liquid overflows the second and third portions 317, 318 of the liquid pathway 315 to form the fluid coupling between the first and second transducer assemblies 210, 230 and the flat article 50.

Each of the first and second walls 311, 312 comprises a plurality of liquid distribution openings 313 formed therethrough that form a passageway from the first portion 316 of the liquid pathway 315 of the liquid manifold 310 to the second and third portions 317, 318 of the liquid pathway 315 of the liquid manifold 310. During use of the apparatus, liquid is supplied from the liquid supply subsystem 16 into the fluid pathway 315, and from the fluid pathway 315 to the surface 51 of the flat article 50. Specifically, the controller 12 is configured to introduce the liquid into the trough so that the liquid fills and overflows the trough 280 during operation of the transducers 212, 232, and the overflowing liquid then forms a fluid coupling between the transducer assemblies 210, 230 and the surface 51 of the flat article 50.

More specifically, in certain embodiments the controller 12 stores process recipes that include instructions regarding the dispensing of the liquid. At the appropriate times in accordance with the process recipes, the controller 12 causes the liquid supply subsystem 16 to operate to flow the liquid from the liquid reservoir 15 into the fluid pathway 315. Specifically, the liquid flows into the first portion 316 of the fluid pathway 315 defined by the first and second walls 311, 312 of the manifold 310 and the first portion 284a of the floor 284 of the trough 280. The liquid then flows from the first portion 316 of the fluid pathway 315 through the liquid distribution openings 313 that are formed into the first and second walls 311, 312 of the manifold 310. The liquid that flows through the liquid distribution openings 313 flows into the second portion 317 of the liquid pathway 315 defined between the second portion 284b of the floor 284, the first wall 311 and the first sidewall 285 and into the third portion 318 of the liquid pathway 315 defined between the third portion 284c of the floor 284, the second wall 312 and the second sidewall 286.

The liquid continues to fill the second portion 317 of the liquid pathway 315 until the liquid rises above a top edge 291 of the first sidewall 285 of the trough 280 and begins to overflow the trough 280. Similarly, the liquid continues to fill the third portion 318 of the liquid pathway 315 until the liquid rises above a top edge 292 of the second sidewall 286 of the trough 280 and begins to overflow the trough 280. The liquid that overflows the trough 280 passes through the first gap $G_1$ between the trough 280 and the first transducer assemblies 210 and through the second gap $G_2$ between the trough 280 and the second transducer assemblies 230. The overflowing liquid creates a liquid cascade as it carries over the top edges 291, 292 of the sidewalls 285, 286 of the trough 280. Arrows are provided in FIGS. 11 and 12 to illustrate the direction of the flow of liquid through the first, second, and third portions 316, 317, 318 of the liquid passageway 315 and into the first and second gaps $G_1$, $G_2$.

Furthermore, due to the close positioning between the trough 280 and the first and second transducer assemblies 210, 230 (i.e., due to the small width of the first and second gaps $G_1$, $G_2$), the overflowing liquid may contact the first and second transducer assemblies 210, 230 as it is falling through the first and second gaps $G_1$, $G_2$ towards the flat article 50. As a result, the overflowing liquid is brought into contact with the flat article 50 in a gentle manner as it runs along the first and second transducer assemblies 210, 230, thereby avoiding any potential damage that may otherwise occur to the flat article 50 by dispensing the liquid directly onto the flat article 50 via a separate dispensing mechanism. Stated another way, using the cascade overflow/waterfall type of dispensing, pressure on the flat article 50 as a result of the liquid being dispensed thereon is reduced or altogether avoided. Furthermore, because the overflowing liquid may contact the first and second transducer assemblies 210, 230 as it falls towards the surface 51 of the flat article 50, fluid coupling between the first and second transducer assemblies 210, 230 and the surface 51 of the flat article 50 is effectively achieved along the entirety of the length of the trough 280 and the first and second transducer assemblies 210, 230 (which extend adjacent to one another along essentially their entire lengths).

Thus, the trough 280 and the liquid manifold 310 collectively form a dispensing mechanism that forms a part of the acoustic energy treatment apparatus 200. The dispensing mechanism of the acoustic energy treatment apparatus 200 effectively fluidly couples the first and second transducer assemblies 210, 230 to the flat article 50 along their entire lengths. Furthermore, the dispensing mechanism of the acoustic energy treatment apparatus 200 reduces pressure on the flat article 50 during dispensing by cascading the liquid over the first and second sidewalls 285, 286 of the trough 280 upon overflow of the reservoir 283 of the trough 280.

In addition to the liquid dispensing noted above, the acoustic energy treatment apparatus 200 also includes pathways for the flow of gas therethrough in order to cool the transducers 212, 232 during operation to prevent the transducers 212, 232 from overheating. The structure that facilitates the flow of gas as well as the operation of the gas flow will be described herein below with reference to FIGS. 5A, 5B, 13, and 14.

As noted above, the support arm 201 of the acoustic energy treatment apparatus 200 comprises a main body 270 and a cover 271 coupled thereto via a plurality of fasteners 272. The cover 271 of the support arm 201 comprises an air inlet manifold 370 formed therein, the air inlet manifold 370 defining a gas inlet pathway. Specifically, a gas inlet pathway is formed through the cover 271 of the support arm 201 to form the air inlet manifold 370. The air inlet manifold 370 is defined by a roof 371 and opposing sidewalls 372. When the cover 271 is coupled to the main body 270 of the support arm 201, the air inlet manifold 370 forms a fully enclosed air inlet pathway through the cover 271 that is defined between the roof 371, the opposing sidewalls 372, and a top surface 273 of a portion 274 of the main body 270 of the support arm 201.

A plurality of air distribution passageways are formed into the cover 271 and extend from first air distribution openings 373 formed into the sidewalls 372 of the air inlet manifold 370 to second air distribution openings 374 formed into a bottom surface 375 of the cover 271. When the acoustic energy treatment apparatus 200 is fully assembled, the second air distribution openings 374 are aligned with one of the air inlet fittings 221, 241. More specifically, in the assembled apparatus one of the air inlet fittings 221, 241 extends into each one of the second air distribution openings 374. In fact, in the exemplified embodiment (see FIG. 14), one of the fittings 221 extends through each of the second air distribution opening 374 and into the passageway between the first and second air distribution openings 373, 374. Thus, air can be introduced into the air inlet manifold 370 (such as through an air injector nozzle 385 that is operably and fluidly coupled to the gas supply subsystem 26) and can flow from the air inlet manifold, into the first air distribution openings 373 and into the air distribution passageways, out the second air distribution openings 374, and into the air inlet fittings 221, 241. From the air inlet fittings 221, 241, the air or gas can flow through the openings 219, 239 in each of the first and second housings 211, 231 and into the cavities 219, 239 of the first and second housings 211, 231 for cooling the first and second transducers 212, 232.

The above describes how air can be introduced into the support arm 201. After being introduced into the support arm 201 and to the cavities 218, 238, the air is heated and flows through the support arm 201 to an outlet 359. In that regard, the main body 270 of the support arm 201 comprises an air outlet manifold 350 (see FIG. 5A) that defines an air outlet pathway. In certain embodiments, electrical connections such as wires and the like may pass through the air outlet pathway. For example, wires that may be used to transmit energy to the transducers 212, 232 may be positioned within the air outlet pathway of the air outlet manifold 350. It should be appreciated that the terms air and gas are used synonymously herein and can be any of the gases noted above or any other gas that can be used to cool the transducers 212, 232 during operation as would be appreciated by persons of ordinary skill in the art.

In the exemplified embodiment, the air outlet manifold 350 comprises two separate air outlet pathways to enable air to flow out of the first and second plurality of transducer assemblies 210, 230 towards the outlet 359. Of course, the invention is not to be so limited in all embodiments and it should be appreciated that if only one set of transducer assemblies 210, 230 is used, only one air outlet pathway may be needed. The air outlet manifold 350 is recessed below the top surface 273 of the main body 270 of the support arm 201 and the separate air outlet pathways of the air outlet manifold 350 are separated from one another by the portion 274 of the main body 270. Each of the passageways of the air outlet manifold 350 is defined by a peripheral upstanding wall 352. In the fully assembled acoustic energy treatment apparatus 200, the air outlet pathways of the air outlet manifold 350 are defined between the bottom surface 375 of the cover member 371 and the upstanding walls 352.

However, the air outlet manifold 350 does not form a fully enclosed air outlet pathway, but rather a plurality of openings 351 are formed into main body 270 of the support arm 201 within the air outlet manifold 350. Each one of the openings 351 is aligned with the opening 219, 239 of one of the housings 211, 231 of the transducer assemblies 210, 230 and hence also with the cavity 318 of one of the housings 211, 231. Thus, the air that enters into the cavities 218, 238 as discussed above flows out of the cavities 218, 238 through the openings 351 and into one of the passageways of the air outlet manifold 350.

When fully assembled, the second air distribution openings 374 and the air inlet fittings 221, 241 are aligned with the openings 351. Thus, the incoming air flows into the air inlet manifold 370 and through the air distribution passageways. However, the incoming air is prevented from mixing with the outgoing air due to the placement of the air inlet fittings 221, 241 that extend through the openings 351 from the cavities 218, 238 of the housings 211, 231 to the second air distribution openings 374. Thus, the incoming air flows out of the second air distribution openings 374, into and through the air inlet fittings 221, 241, and into the cavities 218, 238 without mixing with the outgoing gas or air. From the cavities 218, 238, the air flows through the openings 351 (external to the air inlet fittings 221, 241, thereby preventing the outgoing air/gas from mixing with the incoming air/gas) and into the air outlet manifold 350 where the air then exits the acoustic energy treatment apparatus 200 via the outlet 359. The air/gas that flows into the cavities 218, 238 is preferably a cooled air and the air that flows from the cavities to the outlet 359 is likely a heated gas/air because the cooler incoming air is heated by the transducers 212, 232 and then made to flow out of the cavities 218, 238 towards the outlet 359. By continuously or intermittently flowing cool air into the cavities 218, 238 of the housings 211, 231, the transducers 212, 232 can be cooled to prevent them from overheating.

Figure 13:
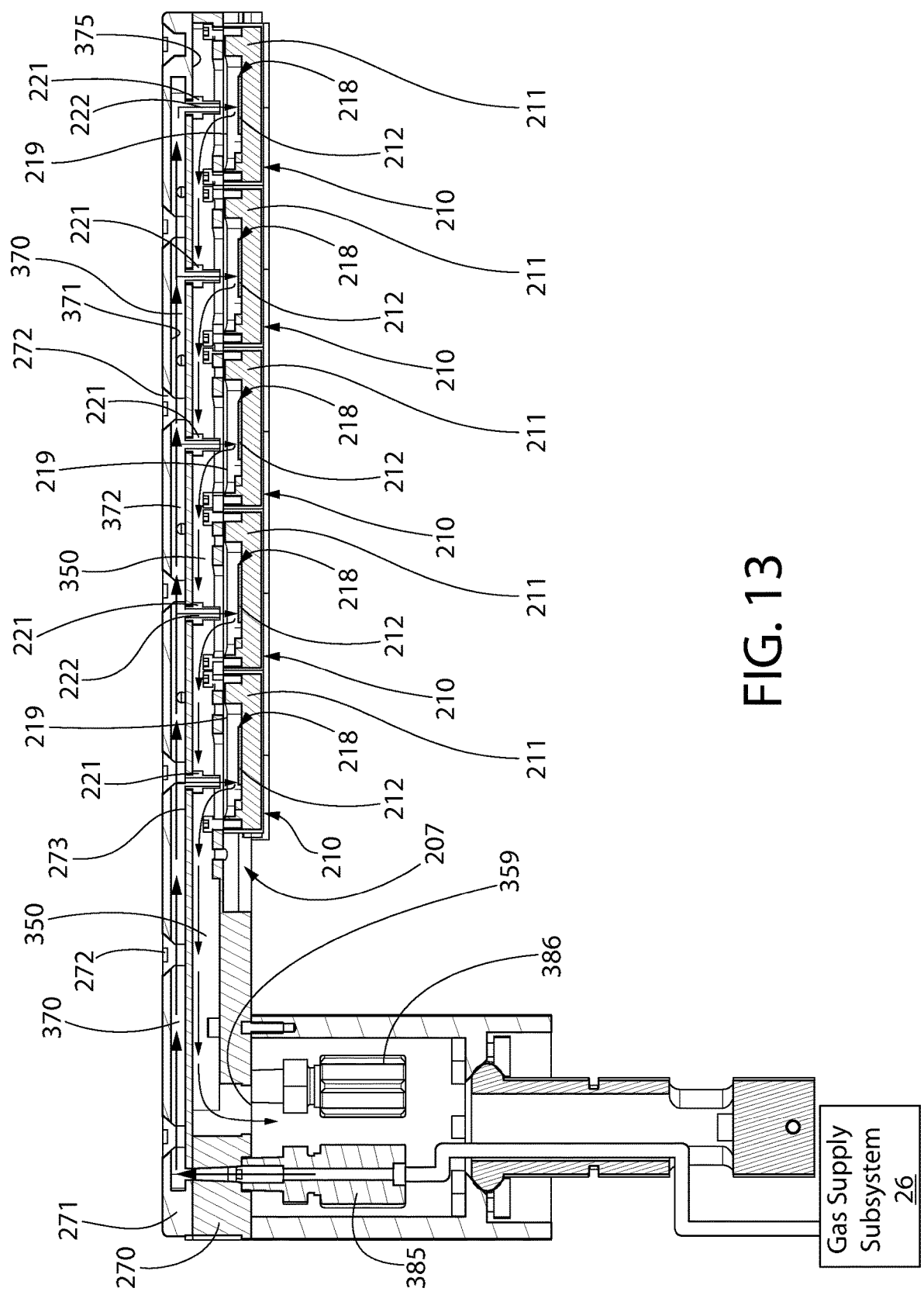
FIG. 13 is a cross-sectional view taken along line XIII-XIII in FIG. 9.
Figure 14:
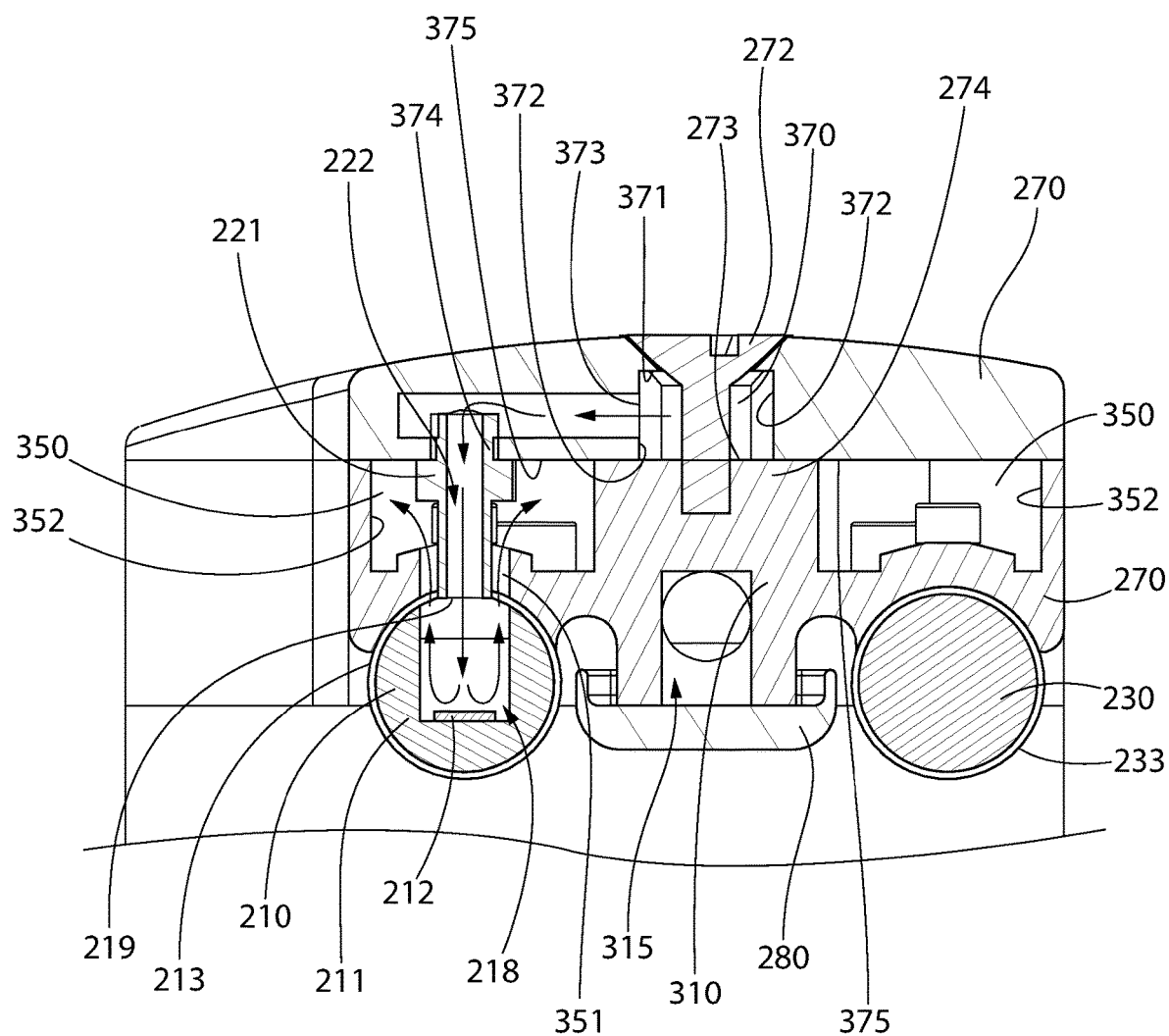
FIG. 14 is a cross-sectional view taken along line XIV-XIV in FIG. 8.

The air flow into and out of the cavities 218, 238 via the gas inlet pathways and the gas outlet pathways is depicted with arrows in FIGS. 13 and 14. As can be seen in FIGS. 13 and 14, the air inlet pathway formed by the air inlet manifold 370 is isolated from the air outlet pathway(s) formed by the air outlet manifold 350. Furthermore, the air inlet pathway and each of the air outlet pathways are also isolated from the liquid pathway 315 defined by the liquid manifold 310.

Figure 15:
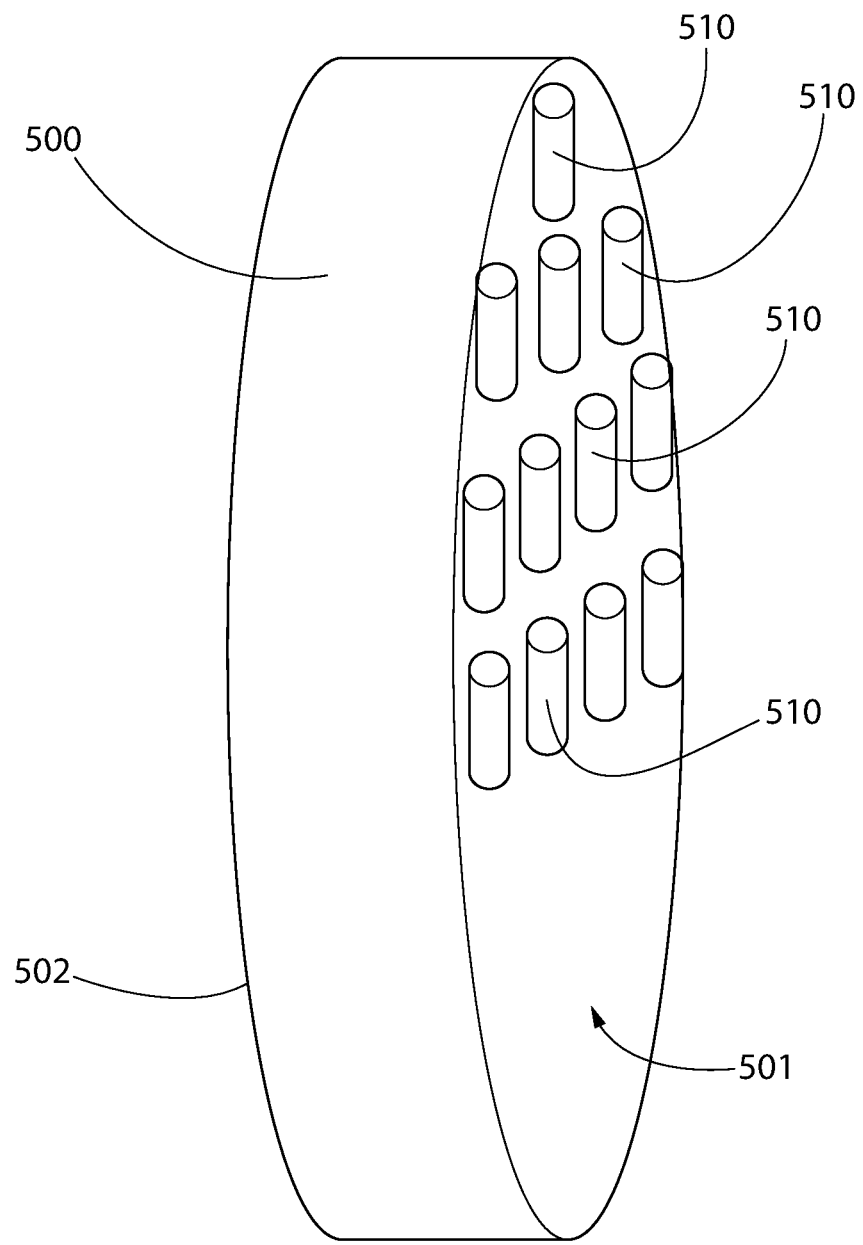
FIG. 15 is a schematic of a system for processing flat articles in accordance with another embodiment of the present invention.

Referring briefly to FIG. 15, another embodiment utilizing the concept of having a single transducer housed within an individual housing to provide acoustic energy to a flat article is illustrated. Specifically, FIG. 15 illustrates a flat article 500 having a front surface 501 and a rear surface 502. A plurality of transducer assemblies 510 are positioned adjacent to the front surface 501 of the flat article 500. Each of the transducer assemblies 510 comprises a housing having a transducer coupled thereto, similar to the transducer assemblies 210, 230 described above. Furthermore, the housings of the transducer assemblies 510 may be disposed within a shell that is similar to the shell 213, 233 described above. However, in FIG. 15 the transducer assemblies 510 are not coupled to a support arm or similar component. Rather, the transducer assemblies 510 are located adjacent to but slightly spaced from the front surface 501 of the flat article 500 and are arranged in an array. In the exemplified embodiment, the transducer assemblies 510 of the array are positioned adjacent to slightly greater than one-half of the front surface 501 of the flat article 500. During use, a liquid would be dispensed onto the front surface 501 of the flat article 500 so that the transducer assemblies 510 are each fluidly coupled to the front surface 501 of the flat article 500 through the liquid in a similar manner to that described above. FIG. 15 simply illustrates another potential use of the transducer assemblies 510 that comprise separate and distinct housings, each with a single transducer therein. Furthermore, in this configuration each of the transducer assemblies 510 can generate acoustic energy to the front surface 501 of the flat article 500 at a different angle (or the same angle if so desired). Thus, there is ample flexibility in the use of the transducer assemblies 510 either as a part of the acoustic energy treatment apparatus 200 as described above or as a part of an array as illustrated in FIG. 15.

As used throughout, ranges are used as shorthand for describing each and every value that is within the range. Any value within the range can be selected as the terminus of the range. In addition, all references cited herein are hereby incorporated by reference in their entireties. In the event of a conflict in a definition in the present disclosure and that of a cited reference, the present disclosure controls.

While the invention has been described with respect to specific examples including presently preferred modes of carrying out the invention, those skilled in the art will appreciate that there are numerous variations and permutations of the above described systems and techniques. It is to be understood that other embodiments may be utilized and structural and functional modifications may be made without departing from the scope of the present invention. Thus, the spirit and scope of the invention should be construed broadly as set forth in the appended claims.

What is claimed is:

1. A system for processing flat articles comprising:
a support for rotatably supporting a flat article;
an acoustic energy treatment apparatus comprising:
a support arm extending along a first longitudinal axis from a proximal end to a distal end;
a first transducer assembly coupled to the support arm and extending along a length, the first transducer assembly comprising a first transducer for generating acoustic energy; and
a trough coupled to the support arm adjacent to the first transducer assembly, the trough extending along at least a portion of the length of the first transducer assembly, wherein a floor of the trough lies in a plane that intersects the first transducer assembly;
a liquid supply subsystem configured to introduce a liquid into the trough; and
a controller operably coupled to the liquid supply subsystem, the controller configured to introduce the liquid into the trough so that the liquid fills and overflows the trough during operation of the first transducer assembly, the overflowing liquid forming a fluid coupling between the first transducer assembly and a surface of the flat article.

2. The system according to claim 1 further comprising a second transducer assembly coupled to the support arm and extending along a length, the second transducer assembly comprising a second transducer for generating acoustic energy, and wherein the trough is located between the first and second transducer assemblies.

3. A system for processing flat articles comprising:
a support for rotatably supporting a flat article;
an acoustic energy treatment apparatus comprising:
a support arm extending along a first longitudinal axis from a proximal end to a distal end;
a first transducer assembly coupled to the support arm and extending along a length, the first transducer assembly comprising a first transducer for generating acoustic energy;
a second transducer assembly coupled to the support arm and extending along a length, the second transducer assembly comprising a second transducer for generating acoustic energy; and a trough coupled to the support arm between the first and second transducer assemblies, the trough extending along at least a portion of the lengths of the first and second transducer assemblies, wherein a bottom surface of the trough lies in a plane that intersects the first transducer assembly;

a liquid supply subsystem configured to introduce a liquid into the trough; and a controller operably coupled to the liquid supply subsystem, the controller configured to introduce the liquid into the trough so that the liquid fills and overflows the trough during operation of the first transducer assembly, the overflowing liquid forming a fluid coupling between the first transducer assembly and a surface of the flat article; and wherein the trough is located along the first longitudinal axis, the first transducer assembly is located along a second longitudinal axis, and the second transducer assembly is located along a third longitudinal axis, the second and third longitudinal axes being on opposite sides of the first longitudinal axis, and the first, second, and third longitudinal axes being substantially parallel.

4. The system according to claim 1 further comprising a plurality of the first transducer assemblies coupled to the support arm, each of the first transducer assemblies comprising a first housing and one of the first transducers acoustically coupled to the first housing, each of the first housings extending from a first end to a second end, the first housings positioned adjacent to one another in an end-to-end manner along a second longitudinal axis.

5. The system according to claim 1 wherein the trough is spaced apart from the first transducer assembly by a first gap.

6. The system according to claim 5 wherein the trough comprises a first sidewall extending upwardly from a first side of the floor and a second sidewall extending upwardly from a second side of the floor, a reservoir defined between the floor and the first and second sidewalls.

7. The system according to claim 6 further comprising a liquid manifold forming a liquid pathway through the support arm, the liquid manifold comprising first and second walls extending upwardly from the floor of the trough and located between the first and second sidewalls of the trough, the first wall of the liquid manifold spaced apart from the first sidewall of the trough by a third gap and the second wall of the liquid manifold spaced apart from the second sidewall of the trough by a fourth gap.

8. The system according to claim 7 wherein the floor of the trough comprises a first portion located between the first and second walls of the liquid manifold, a second portion located between the first wall of the liquid manifold and the first sidewall of the trough, and a third portion located between the second wall of the liquid manifold and the second sidewall of the trough, and wherein a first portion of the liquid pathway is defined by the first portion of the floor of the trough and the first and second walls of the liquid manifold, a second portion of the liquid pathway is defined by the second portion of the floor of the trough, the first wall of the liquid manifold, and the first sidewall of the trough, and a third portion of the liquid pathway is defined by the third portion of the floor of the trough, the second wall of the liquid manifold, and the second sidewall of the trough, a plurality of liquid distribution openings formed through each of the first and second walls of the liquid manifold, the fluid distribution openings forming a passageway from the first portion of the liquid pathway to each of the second and third portions of the liquid pathway, and wherein the controller is configured to introduce the liquid into the first portion of the liquid pathway, through the fluid distribution openings, and into the second and third portions of the liquid pathway, and wherein the liquid in the second and third portions of the liquid pathway overflows the trough and forms the fluid coupling between the first transducer assembly and the surface of the flat article.

9. The system according to claim 1 further comprising:

a gas supply subsystem operably coupled to the acoustic energy treatment apparatus;

a gas inlet pathway extending through the support arm from the gas supply subsystem to the first transducer assembly; and a gas outlet pathway extending through the support arm from the first transducer assembly to an outlet, wherein the gas inlet pathway and the gas outlet pathway are isolated from one another; and the controller operably coupled to the gas supply subsystem, the controller configured to introduce a gas along or into the first transducer assembly to cool the first transducer.

10. A system for processing flat articles comprising:

a support for rotatably supporting a flat article;

an acoustic energy treatment apparatus comprising:

a support arm extending along a first longitudinal axis from a proximal end to a distal end;

a first transducer assembly coupled to the support arm and extending along a length, the first transducer assembly comprising a first transducer for generating acoustic energy; and a trough coupled to the support arm adjacent to the first transducer assembly, the trough extending along at least a portion of the length of the first transducer assembly, wherein a bottom surface of the trough lies in a plane that intersects the first transducer assembly;

a liquid supply subsystem configured to introduce a liquid into the trough; and a controller operably coupled to the liquid supply subsystem, the controller configured to introduce the liquid into the trough so that the liquid fills and overflows the trough during operation of the first transducer assembly, the overflowing liquid forming a fluid coupling between the first transducer assembly and a surface of the flat article; and wherein a portion of the first transducer assembly protrudes from the plane and is located between the plane and the support.

11. A system for processing flat articles comprising:

a support for rotatably supporting a flat article;

an acoustic energy treatment apparatus comprising:

a support arm;

a first transducer assembly coupled to the support arm, the first transducer assembly comprising a first transducer for generating acoustic energy; and a trough coupled to the support arm adjacent to the first transducer assembly, the trough being spaced apart from the first transducer assembly by a gap;

a liquid supply subsystem configured to introduce a liquid into the trough; and a controller operably coupled to the liquid supply subsystem, the controller configured to introduce the liquid into the trough so that the liquid fills and overflows the trough during operation of the first transducer assembly, the overflowing liquid flowing through the gap between the trough and the first transducer assembly.

12. The system according to claim 11 wherein the overflowing liquid contacts the first transducer assembly as it falls through the gap.

13. The system according to claim 11 wherein the acoustic energy treatment apparatus is positioned adjacent to the support so that during operation a film of the liquid is formed between the first transducer assembly and the flat article on the support to fluidly couple the acoustic energy treatment apparatus to the flat article.

14. The system according to claim 11 wherein at least a portion of the first transducer assembly is positioned closer to the support than the trough.

15. The system according to claim 14 wherein a bottom surface of the trough lies in a plane that intersects the first transducer assembly, and wherein the portion of the first transducer assembly protrudes from the plane and is located between the plane and the support.

16. The system according to claim 11 wherein the support arm extends along a longitudinal axis, and wherein the trough is aligned with the longitudinal axis and the first transducer assembly is offset from the longitudinal axis.

\* \* \* \* \*